US012740060B2

(12) United States Patent
Kwon et al.

(10) Patent No.: US 12,740,060 B2
(45) Date of Patent: Sep. 15, 2026

(54) NAND PLANE BOUNDARY SHRINK

(71) Applicant: Sandisk Technologies, Inc., Milpitas, CA (US)

(72) Inventors: Ohwon Kwon, Pleasanton, CA (US); Yuki Mizutani, San Jose, CA (US); Arka Ganguly, Scotts Valley, CA (US); Kou Tei, San Jose, CA (US); Yonggang Wu, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 526 days.

(21) Appl. No.: 18/358,584

(22) Filed: Jul. 25, 2023

(65) Prior Publication Data

US 2024/0215240 A1 Jun. 27, 2024

Related U.S. Application Data

(60) Provisional application No. 63/477,040, filed on Dec. 23, 2022.

(51) Int. Cl.

| | |
|---|---|
| ***H10B 43/27*** | (2023.01) |
| ***H10B 41/10*** | (2023.01) |
| ***H10B 41/27*** | (2023.01) |
| ***H10B 41/41*** | (2023.01) |
| ***H10B 43/10*** | (2023.01) |
| ***H10B 43/35*** | (2023.01) |
| ***H10B 43/40*** | (2023.01) |
| ***H10B 43/50*** | (2023.01) |

(52) U.S. Cl.

CPC ............. *H10B 43/27* (2023.02); *H10B 41/10* (2023.02); *H10B 41/27* (2023.02); *H10B 41/41* (2023.02); *H10B 43/10* (2023.02); *H10B 43/35* (2023.02); *H10B 43/40* (2023.02); *H10B 43/50* (2023.02)

(58) Field of Classification Search

CPC ........ H10B 41/10–35; H10B 43/10–35; H10B 41/00–70; H10B 43/00–50

See application file for complete search history.

(56) References Cited

U.S. PATENT DOCUMENTS

| | | | |
|---|---|---|---|
| 8,951,859 | B2 | 2/2015 | Higashitani et al. |
| 9,960,181 | B1 | 5/2018 | Cui et al. |
| 10,269,817 | B2 | 4/2019 | Ogawa et al. |
| 11,139,237 | B2 | 10/2021 | Shao et al. |
| 11,289,429 | B2 | 3/2022 | Shimamoto |

(Continued)

*Primary Examiner* — Christine S. Kim
*Assistant Examiner* — Tyler J Wiegand
(74) *Attorney, Agent, or Firm* — Pearl Cohen LLP

(57) ABSTRACT

Technology is disclosed herein for a memory device having a narrow gap between planes and a method of shrinking the gap between planes. A first and second adjacent planes each has a word line (WL) hookup region at mid-plane. A dummy array region resides between the two planes. The dummy array region may contain a stack of alternating layers of a first insulating material and a second insulating material. There is a first electrical isolation structure between the dummy array region and a stack in the first plane. There is a second electrical isolation structure between the dummy array region and a stack in a second plane. The electrical isolation structures may be formed in narrow trenches. The combination of the dummy array region and the two electrical isolation structures results in a very short gap between the adjacent planes.

19 Claims, 16 Drawing Sheets

(56) References Cited

U.S. PATENT DOCUMENTS

| | | | | |
|---|---|---|---|---|
| 2017/0236746 | A1 | 8/2017 | Yu et al. | |
| 2019/0043872 | A1* | 2/2019 | Oh | G11C 16/0483 |
| 2019/0371811 | A1* | 12/2019 | Oike | H01L 23/528 |
| 2020/0203364 | A1* | 6/2020 | Totoki | H10B 41/35 |
| 2020/0279858 | A1* | 9/2020 | Xie | H10D 30/694 |
| 2022/0189984 | A1 | 6/2022 | Okina | |
| 2023/0033311 | A1* | 2/2023 | Yang | H10B 43/10 |
| 2023/0413551 | A1* | 12/2023 | Chen | H10B 41/10 |

* cited by examiner

Storage System 100
Memory Controller 120
102
Host
152
Host Interface
156
Processor
158
ECC Engine
160
Memory Interface
130
Storage
NOC
154
Local Memory Controller
164
local memory
140

307
301
memory structure 302
308
306
311
row decoder 322
array drivers 324
block select 326
row control circuitry 320
column decoder 312
driver circuits 314
R/W Circuits 325
column control circuitry 310
Control Die
row address signals
control signals
control signals
column address signals
System Control Logic 360
State Machine 362
Storage 366
Power Control 364
Interface 368
Memory Controller 522
AA
SW
570
562
WL111
590
571
562
WL110
591
572
562
WL109
592
573
562
WL108
593
574
562
WL107
594
570
563
564
565
566

NAND PLANE BOUNDARY SHRINK

CLAIM OF PRIORITY

The present application claims priority from U.S. Provisional Patent Application No. 63/477,040, entitled "NAND PLANE BOUNDARY SHRINK," by Kwon et al., filed Dec. 23, 2022, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

The memory system typically contains a number of memory dies. Each die may be arranged into units that are commonly referred to as planes. Having multiple planes can increase performance by performing memory operations such as read, program, or erase in parallel in different planes. Each plane may be divided into a number of blocks. Typically only one block in each plane is selected at one time for a memory operation. A block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

In a three-dimensional (3D) memory structure, the memory cells may be arranged in NAND strings that extend vertically through a stack, where the stack comprises alternating conductive and dielectric layers. The conductive layers act as the word lines which are connected to the memory cells. NAND strings may be formed by drilling memory holes through a stack of alternating silicon oxide and sacrificial layers, replacing the sacrificial layers with the conductive layers, and filling the memory holes with annular films of memory cell materials. The conductive layers serve as both the word lines, as well as control gates of the memory cells.

In order to provide operating voltages to the word lines, the stack of alternating conductive and dielectric layers may have staircase structure at one or more edges. FIG. 1A shows one edge of a stack of alternating conductive layers 10 and dielectric layers 12 having a staircase structure. Note that the term "terrace" could also be used to referred to the staircase structure. Typically there will be many more layer conductive layers 10 and many more dielectric layers 12. The conductive layers 10 and dielectric layers 12 will extend in the x-direction as indicated by arrow 18. Electrical contacts 14 make an electrical connection to respective conductive layers 10. The electrical contacts 14 May be referred to as word line (WL) hookups. An operating voltage is provided to an electrical contact 14 to thereby provide the operating volage to a conductive layer 10. An example NAND string 16 is depicted extending vertically through the stack. Note that the conductive layer 10 is typically divided into a number of regions such that the operating voltage is routed to only a small region within the conductive layer 10.

In some cases the semiconductor fabrication process will produce a staircase structure on an edge of the stack even if no operating voltages are provided to that edge of the stack. Such a staircase structure is referred to as a dummy staircase. FIG. 1B depicts an example of a dummy staircase. The conductive layers 10 and dielectric layers 12 will extend in the x-direction as indicated by arrow 22. Fabricating the dummy staircase along with the staircase with the WL hookups can simplify the fabrication process. Moreover, fabricating the dummy staircase along with the staircase with the WL hookups can result in better formation of some structures such as the NAND strings 16 that extend vertically through the stack.

The height of the stacks (in the z-direction) will depend on the number of layers, as well as layer thickness. With each generation, there is a trend towards adding additional layers to the stack thereby increasing the stack height. The width of the staircase in the x-direction may also depend on the number of layers.

BRIEF DESCRIPTION OF THE DRAWINGS

Like-numbered elements refer to common components in the different figures.

DETAILED DESCRIPTION

Technology is disclosed herein for a memory device having a narrow gap between planes and a method of shrinking the gap between planes. In an embodiment, each of two adjacent planes has a word line (WL) hookup region at mid-plane. Each plane may have two stacks of alternating conductive (e.g., word line) layers and insulating layers. The edge of the stack in the WL hookup region may have a staircase structure. However, the edge of the stack adjacent to the other plane does not have a staircase structure. In an embodiment, a dummy array region resides between the two planes. The dummy array region may contain a stack of alternating layers of a first insulating material and a second insulating material. Moreover, there is a first electrical isolation structure between the dummy array region and a first stack in a first plane. The first electrical isolation structure provides electrical isolation between the dummy array region and the word line layers in the first stack. There is a second electrical isolation structure between the dummy array region and a second stack in a second plane. The second electrical isolation structure provides electrical isolation between the dummy array region and the word line layers in the second stack. The electrical isolation structures may be formed in narrow trenches.

The combination of the dummy array region and the two electrical isolation structures results in a very short gap between the adjacent planes. In contrast, some conventional techniques may form a staircase structure at the adjacent edge of each plane (the "adjacent edges" referring to the edge in each plane that are adjacent to each other). These two staircase structures between the two adjacent planes may have a substantial width in the x-direction, which will substantially increase the gap between the two planes.

Also, the dummy memory array may be fabricated using some (but not necessarily all) of the process steps used to form the arrays in the two adjacent planes. Therefore, the dummy memory array is easily fabricated in a cost efficient manner. Moreover, fabricating the dummy memory array and electrical isolation structures does not impair the formation of memory cells in the arrays in the two adjacent planes. Therefore, good quality memory cells are formed, even at the edges of the two adjacent planes.

Figure 1A:
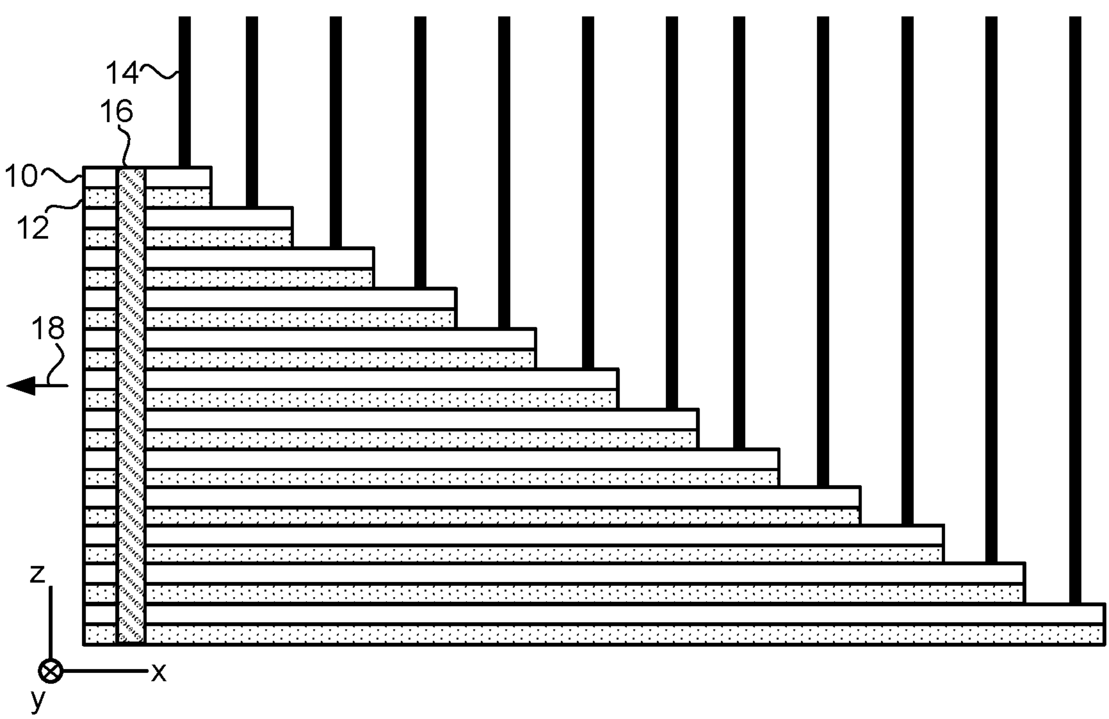
FIG. 1A depicts an example of one edge of a stack of alternating conductive layers and dielectric layers having a staircase structure, which is part of a memory array of a three-dimensional memory structure.
Figure 1B:
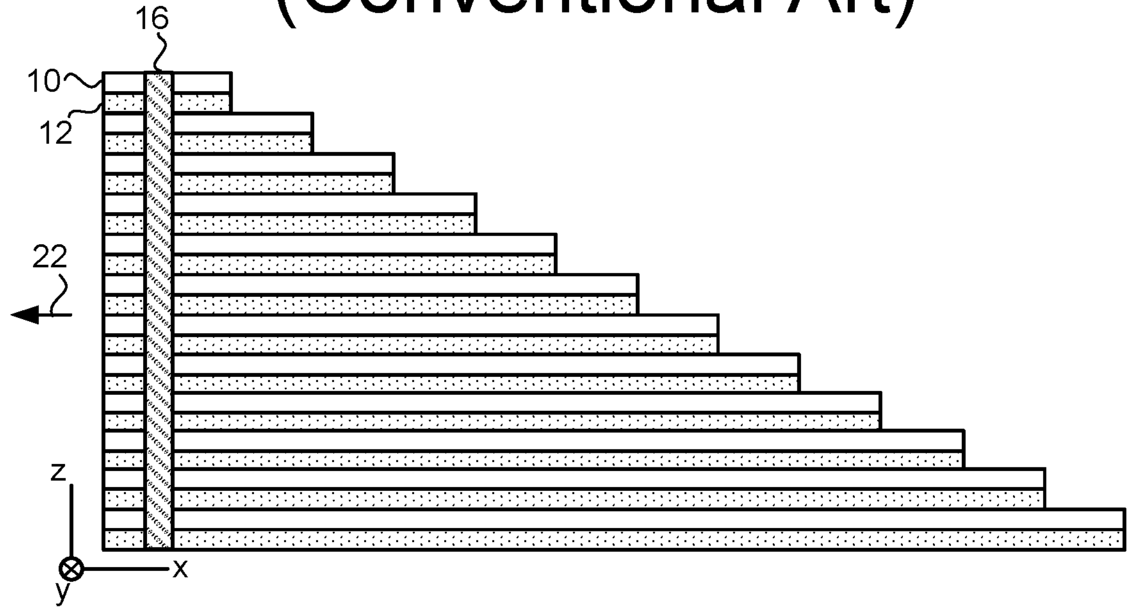
FIG. 1B depicts an example of a dummy staircase of a three-dimensional memory structure.
Figure 2:
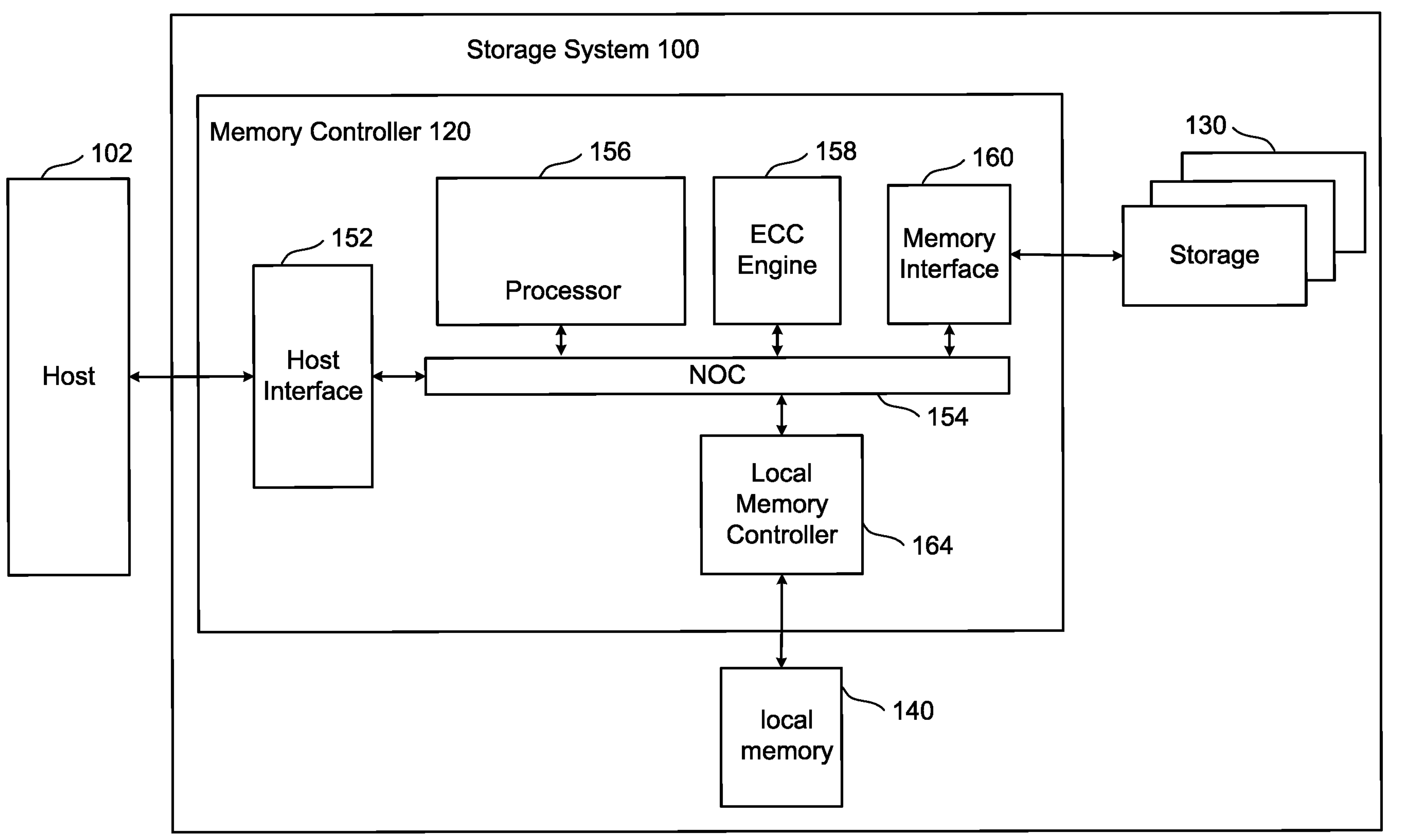
FIG. 2 is a block diagram of one embodiment of a non-volatile memory system connected to a host.

FIG. 2 is a block diagram of one embodiment of a storage system 100. In an embodiment, the storage 130 contains semiconductor dies that have adjacent planes with narrow gaps as described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 2 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 3A:
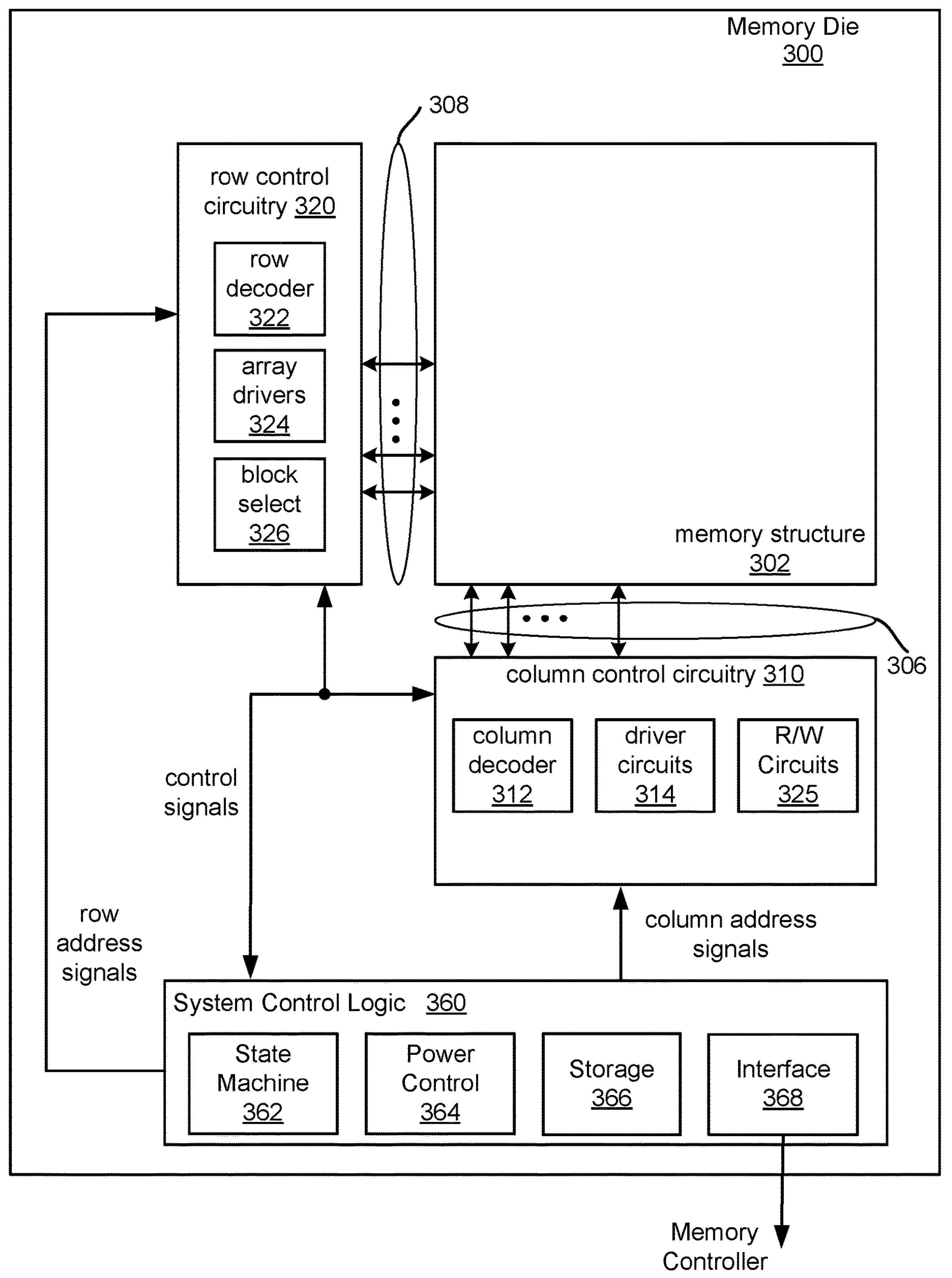
FIG. 3A is a block diagram of one embodiment of a memory die.

In one embodiment, storage 130 comprises one or more memory dies. FIG. 3A is a functional block diagram of one embodiment of a memory die 300 that may reside within storage 130 of non-volatile storage system 100. However, the memory die 300 is not limited to use within non-volatile storage system 100. The components depicted in FIG. 3A are electrical circuits. Memory die 300 includes a memory structure 302 (e.g., memory array) that can comprise non-volatile memory cells (also referred to as non-volatile storage cells), as described in more detail below. The memory structure 302 may contain multiple planes, as described in more detail below.

The array terminal lines of memory structure 302 include the various layer(s) of word lines organized as rows, and the various layer(s) of bit lines organized as columns. However, other orientations can also be implemented. Memory die 300 includes row control circuitry 320, whose outputs are connected to respective word lines of the memory structure 302. Row control circuitry 320 receives a group of M row address signals and one or more various control signals from System Control Logic circuit 360, and typically may include such circuits as row decoders 322, array drivers 324, and block select circuitry 326 for both reading and writing (programming) operations. Row control circuitry 320 may also include read/write circuitry. Memory die 300 also includes column control circuitry 310 including read/write circuits 325. The read/write circuits 325 may contain sense amplifiers and data latches. The sense amplifier(s) input/outputs are connected to respective bit lines of the memory structure 302. Although only a single block is shown for memory structure 302, a memory die can include multiple planes that can be individually accessed, as described below. Column control circuitry 310 receives a group of N column address signals and one or more various control signals from System Control Logic 360, and typically may include such circuits as column decoders 312, array terminal receivers or driver circuits 314, as well as read/write circuitry 325, and I/O multiplexers.

System control logic 360 receives data and commands from memory controller 120 and provides output data and status to the host. In some embodiments, the system control logic 360 (which comprises one or more electrical circuits) includes state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. System control logic 360 can also include a power control module 364 that controls the power and voltages supplied to the rows and columns of the memory structure 302 during memory operations. System control logic 360 includes storage 366 (e.g., RAM, registers, latches, etc.), which may be used to store parameters for operating the memory structure 302.

Commands and data are transferred between memory controller 120 and memory die 300 via memory controller interface 368 (also referred to as a "communication interface"). Memory controller interface 368 is an electrical interface for communicating with memory controller 120. Examples of memory controller interface 368 include a Toggle Mode Interface and an Open NAND Flash Interface (ONFI). Other I/O interfaces can also be used.

In some embodiments, all the elements of memory die 300, including the system control logic 360, can be formed as part of a single die. In other embodiments, some or all of the system control logic 360 can be formed on a different die than the die that contains the memory structure 302.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts: (1) memory structure 302 and (2) peripheral circuitry, which includes all of the other components depicted in FIG. 3A. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies. Three-dimensional NAND structures in particular may benefit from specialized processing operations.

To improve upon these limitations, embodiments described below can separate the elements of FIG. 3A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 3B:
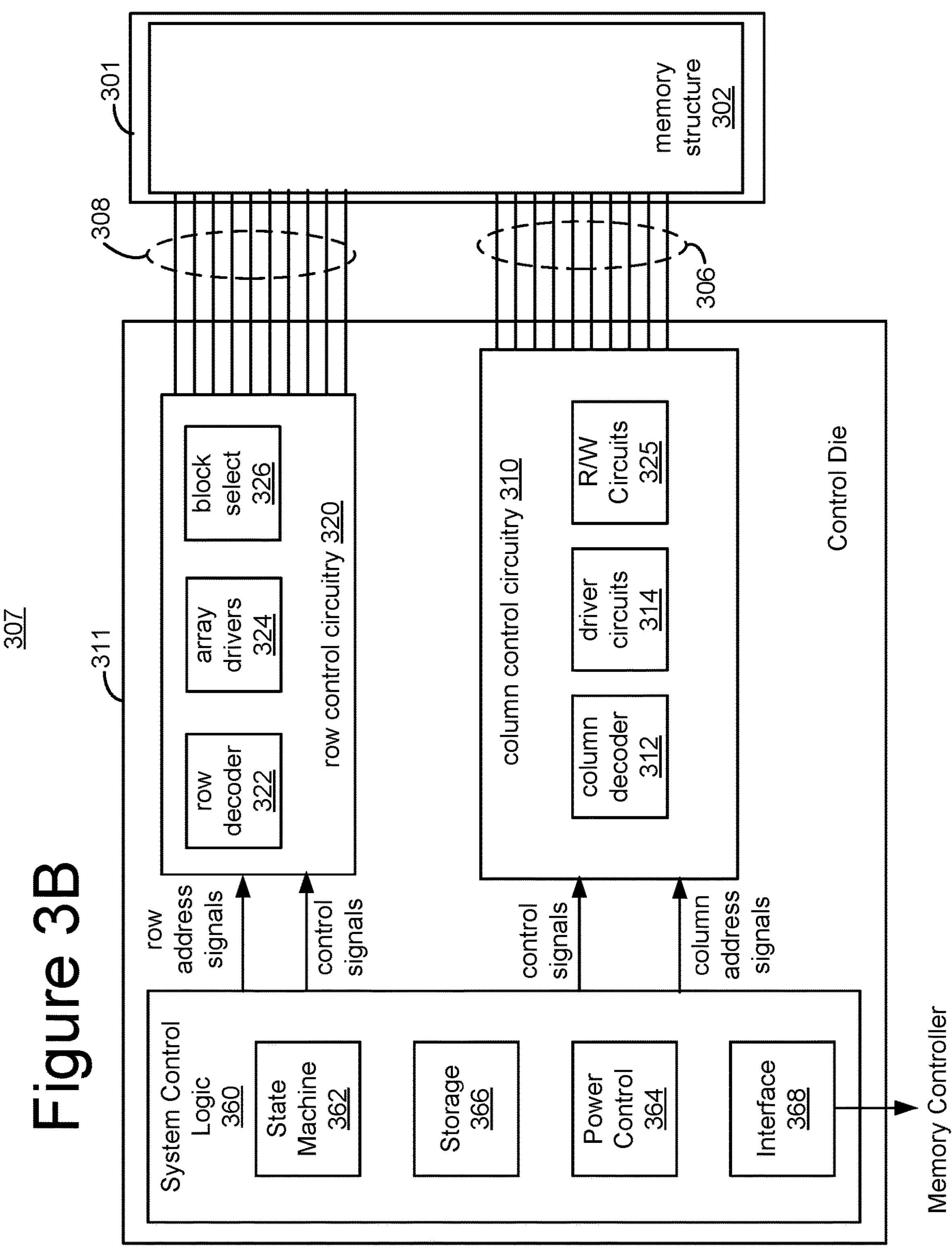
FIG. 3B is a block diagram of one embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. One or more integrated memory assemblies 307 may be used in the memory packages 104 of storage system 100. The integrated memory assembly 307 includes two types of semiconductor dies (or more succinctly, "die"). Memory structure die 301 includes memory structure 302. Memory structure 302 includes non-volatile memory cells. Control die 311 includes control circuitry 360, 310, and 320 (as described above). In some embodiments, control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require many additional process steps. The control die 311 could also be referred to as a CMOS die, due to the use of CMOS technology to implement some or all of control circuitry 360, 310, 320.

FIG. 3B shows column control circuitry 310 including read/write circuits 325 on the control die 311 coupled to memory structure 302 on the memory structure die 301 through electrical paths 306. For example, electrical paths 306 may provide electrical connection between column decoder 312, driver circuitry 314, and R/W circuits 325 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each electrical path 308 may correspond to a word line, dummy word line, or select gate line. Additional electrical paths may also be provided between control die 311 and memory structure die 301.

For purposes of this document, the phrases "a control circuit" or "one or more control circuits" can include any one of or any combination of memory controller 120, state machine 362, all or a portion of system control logic 360, all or a portion of row control circuitry 320, all or a portion of column control circuitry 310, read/write circuits 325, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, memory die 300, integrated memory assembly 307, and/or control die 311.

Figure 3C:
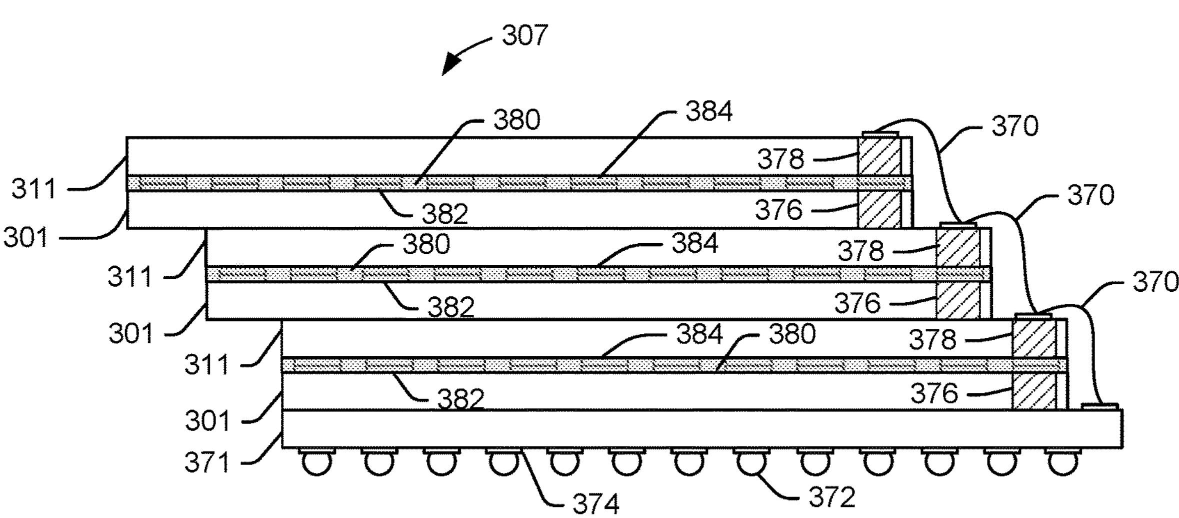
FIGS. 3C and 3D depict different embodiments of integrated memory assemblies.

In some embodiments, there is more than one control die 311 and more than one memory structure die 301 in an integrated memory assembly 307. In some embodiments, the integrated memory assembly 307 includes a stack of multiple control dies 311 and multiple memory structure dies 301. FIG. 3C depicts a side view of an embodiment of an integrated memory assembly 307 stacked on a substrate 371 (e.g., a stack comprising control die 311 and memory structure die). The integrated memory assembly 307 has three control dies 311 and three memory structure dies 301. In some embodiments, there are more than three memory structure dies 301 and more than three control dies 311. In FIG. 3C there are an equal number of memory structure dies 301 and control dies 311; however, in one embodiment, there are more memory structure dies 301 than control dies 311. For example, one control die 311 could control multiple memory structure dies 301.

Each control die 311 is affixed (e.g., bonded) to at least one of the memory structure die 301. Some of the bond pads 382/284 are depicted. There may be many more bond pads. A space between two die 301, 311 that are bonded together is filled with a solid layer 380, which may be formed from epoxy or other resin or polymer. This solid layer 380 protects the electrical connections between the die 301, 311, and further secures the die together. Various materials may be used as solid layer 380.

The integrated memory assembly 307 may for example be stacked with a stepped offset, leaving the bond pads at each level uncovered and accessible from above. Wire bonds 370 connected to the bond pads connect the control die 311 to the substrate 371. A number of such wire bonds may be formed across the width of each control die 311 (i.e., into the page of FIG. 3A).

A memory die through silicon via (TSV) 376 may be used to route signals through a memory structure die 301. A control die through silicon via (TSV) 378 may be used to route signals through a control die 311. The TSVs 376, 378 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 372 may optionally be affixed to contact pads 374 on a lower surface of substrate 371. The solder balls 372 may be used to couple the integrated memory assembly 307 electrically and mechanically to a host device such as a printed circuit board. Solder balls 372 may be omitted where the integrated memory assembly 307 is to be used as an LGA package. The solder balls 372 may form a part of the interface between integrated memory assembly 307 and memory controller 120.

Figure 3D:
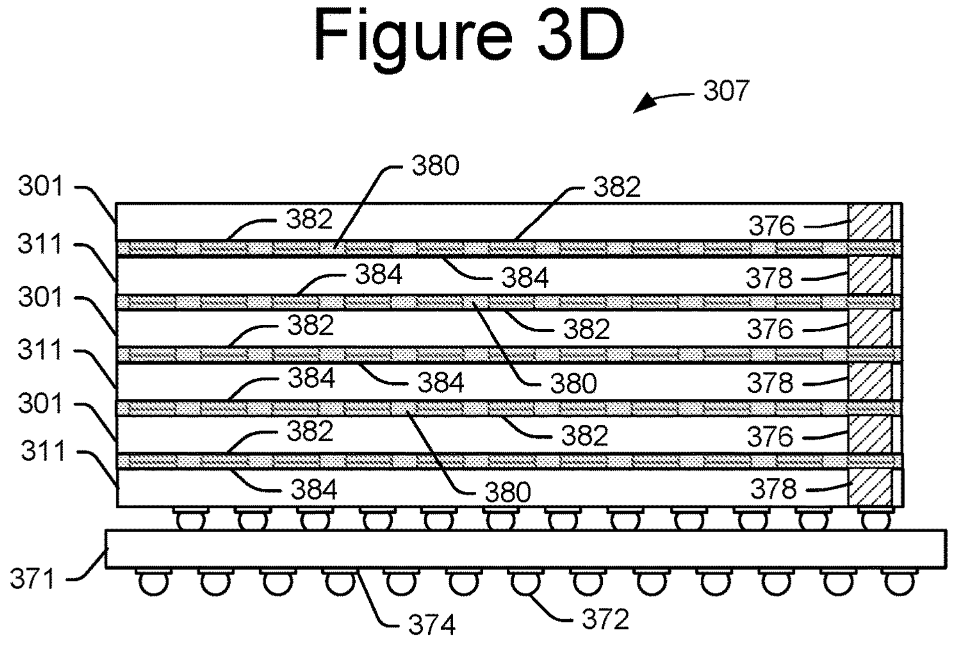

FIG. 3D depicts a side view of another embodiment of an integrated memory assembly 307 stacked on a substrate 371. The integrated memory assembly 307 of FIG. 3C has three control dies 311 and three memory structure dies 301. In some embodiments, there are many more than three memory structure dies 301 and many more than three control dies 311. In this example, each control die 311 is bonded to at least one memory structure die 301. Optionally, a control die 311 may be bonded to two or more memory structure dies 301.

Some of the bond pads 382, 384 are depicted. There may be many more bond pads. A space between two dies 301, 311 that are bonded together is filled with a solid layer 380, which may be formed from epoxy or other resin or polymer. In contrast to the example in FIG. 3C, the integrated memory assembly 307 in FIG. 3D does not have a stepped offset. A memory die through silicon via (TSV) 376 may be used to route signals through a memory structure die 301. A control die through silicon via (TSV) 378 may be used to route signals through a control die 311.

Solder balls 372 may optionally be affixed to contact pads 374 on a lower surface of substrate 371. The solder balls 372 may be used to couple the integrated memory assembly 307 electrically and mechanically to a host device such as a printed circuit board. Solder balls 372 may be omitted where the integrated memory assembly 307 is to be used as an LGA package.

As has been briefly discussed above, the control die 311 and the memory structure die 301 may be bonded together. Bond pads on each die 301, 311 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 301, 311. Where no such film is initially provided, a space between the die may be under filled with an epoxy or other resin or polymer. The under-fill material may be applied as a liquid which then hardens into a solid layer. This under-fill step protects the electrical connections between the dies 301, 311, and further secures the die together. Various materials may be used as under-fill material.

Figure 4:
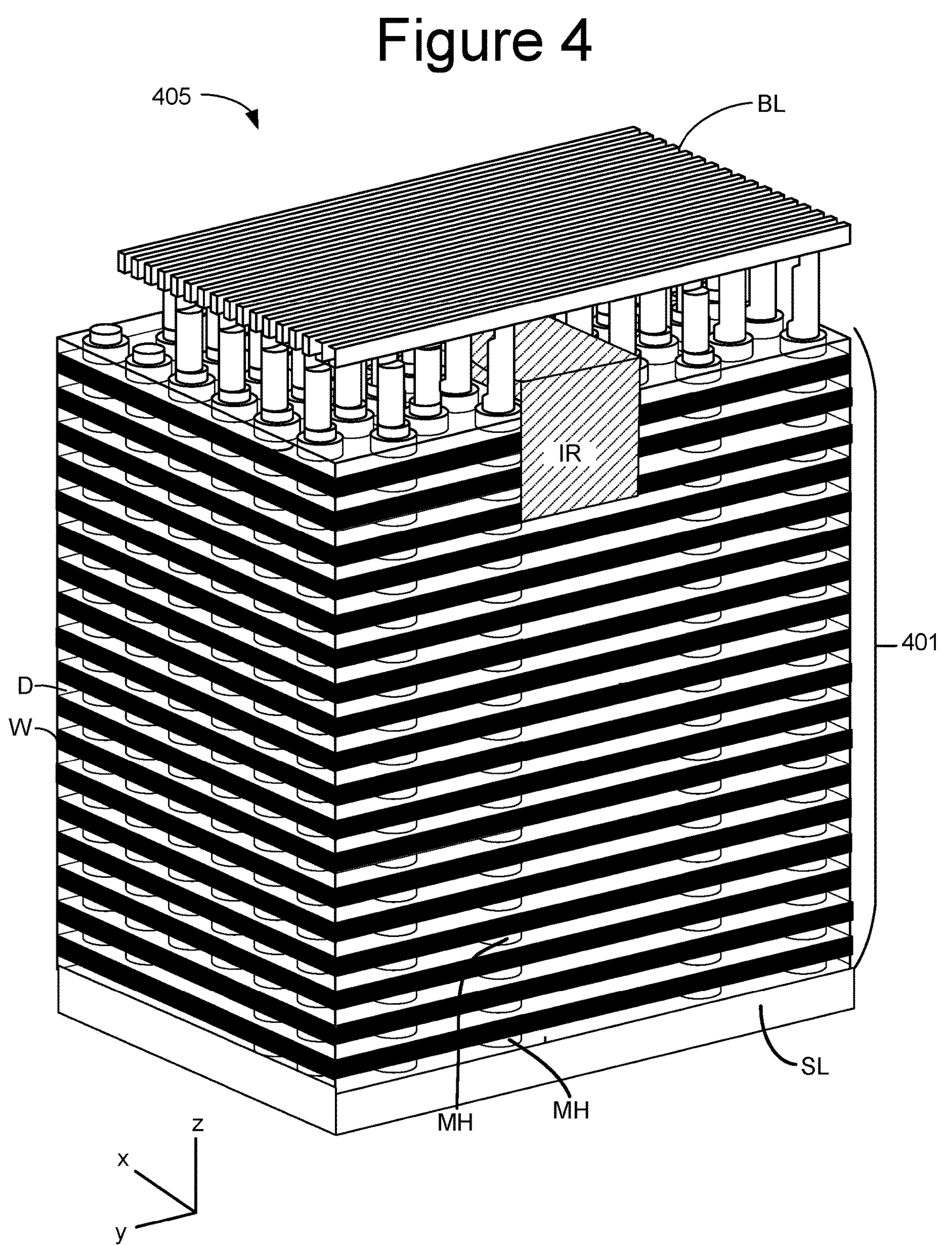
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 405 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into five (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, a NAND string is formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
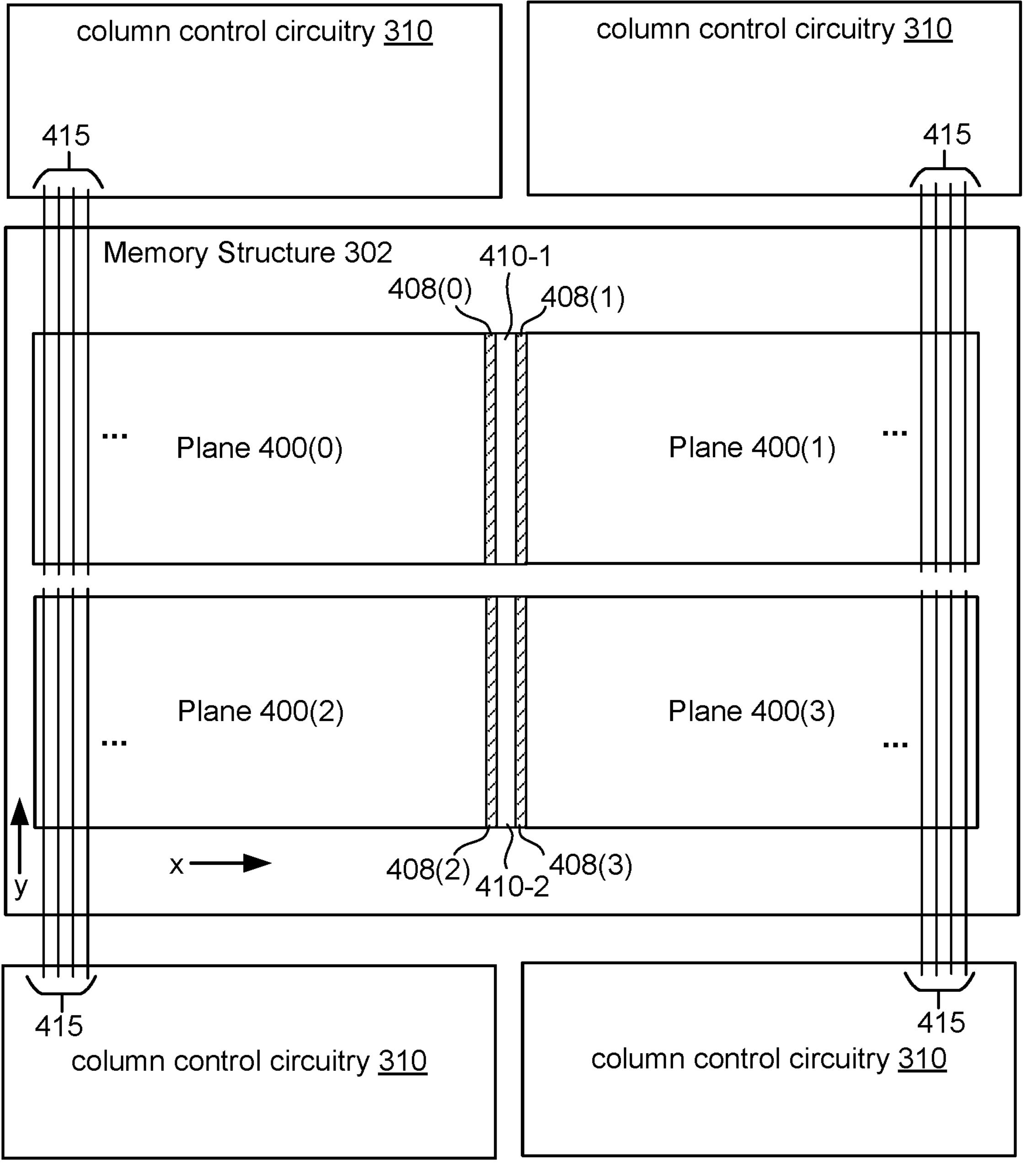
FIG. 4A is a block diagram depicting one embodiment of an organization of a memory structure of a memory die.

FIG. 4A is a block diagram depicting one embodiment of an organization of a memory structure 302 of a memory die 300. The memory structure 302 is divided into four planes 400(0), 400(1), 400(2), 400(3). Each plane is then divided into a number of blocks (blocks are not depicted in FIG. 4A). Plane 400(0) and plane 400(1) are separated from each other by two electrical isolation structures 408(0) and 408(1). In an embodiment, there is a dummy memory array 410-1 between the two electrical isolation structures 408(0) and 408(1). Plane 400(2) and plane 400(3) are separated from each other by two electrical isolation structures 408(3) and 408(4). In an embodiment, there is a dummy memory array 410-2 between the two electrical isolation structures 408(2) and 408(3).

Each plane has a number of bit lines 415, with each bit line extending the in the y-direction. Only a few of perhaps thousands of bit lines 415 per plane are depicted. The column control circuitry 310 contains a number of read/write circuits that contain sense amplifiers. Each bit line 415 may connect to a sense amplifier. In one embodiment, the column control circuitry 310 is on the same semiconductor die as the memory structure. In one embodiment, the column control circuitry 310 is located under the memory structure 302 in a "circuit under array" (CuA) configuration. In one embodiment, the column control circuitry 310 is on a different semiconductor die than the memory structure. For example, the column control circuitry 310 may reside on the control die 311 with the memory structure 302 on the memory structure die 301 (see FIG. 3B). Therefore, the location of the column control circuitry 310 depicted in FIG. 4A is not intended to depict the actual location relative to the memory structure 302. Thus, note that the arrows labeling the x-direction and the y-direction pertain to the memory structure 302, but do not necessarily pertain to the column control circuitry 310. The row control circuitry are not depicted in FIG. 4A. In one embodiment, the row control circuitry is located under the memory structure 302 in the CuA configuration. In one embodiment, the row control circuitry is on a different semiconductor die than the memory structure. For example, the row control circuitry 320 may reside on the control die 311 with the memory structure 302 on the memory structure die 301 (see FIG. 3B).

Figure 4B:
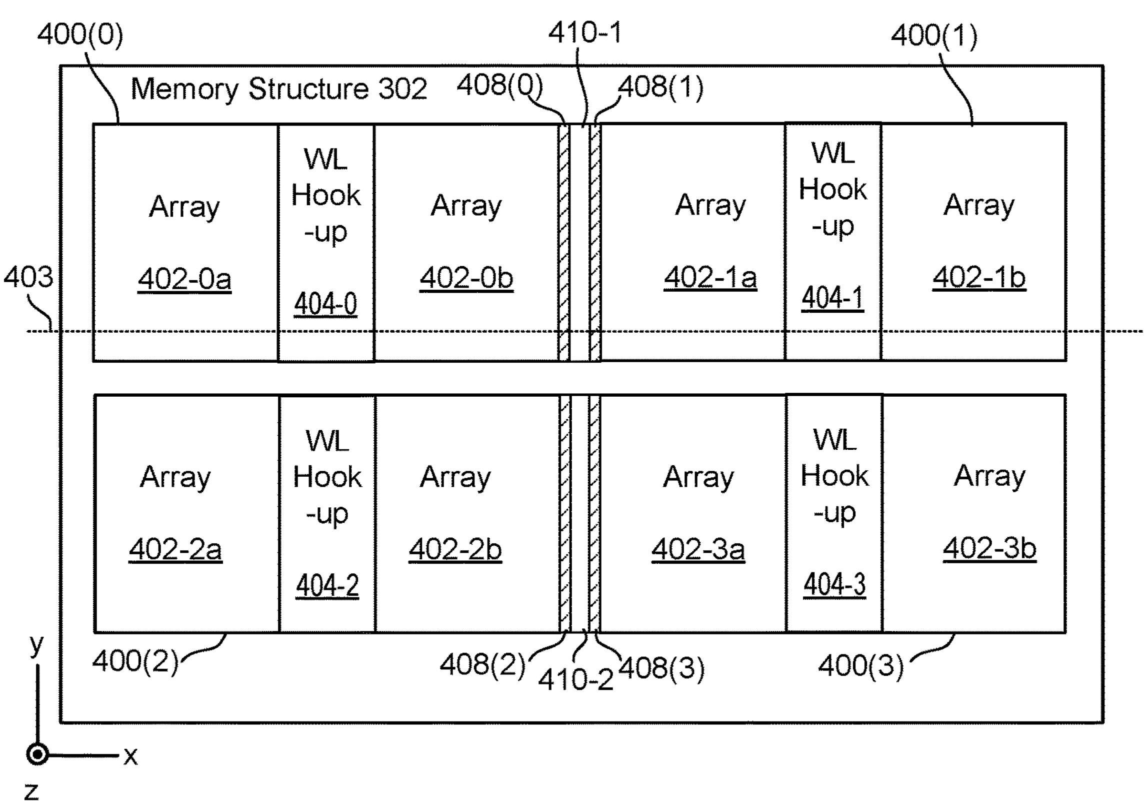
FIG. 4B is a block diagram depicting one embodiment of an organization of memory structure.
Figure 4C:
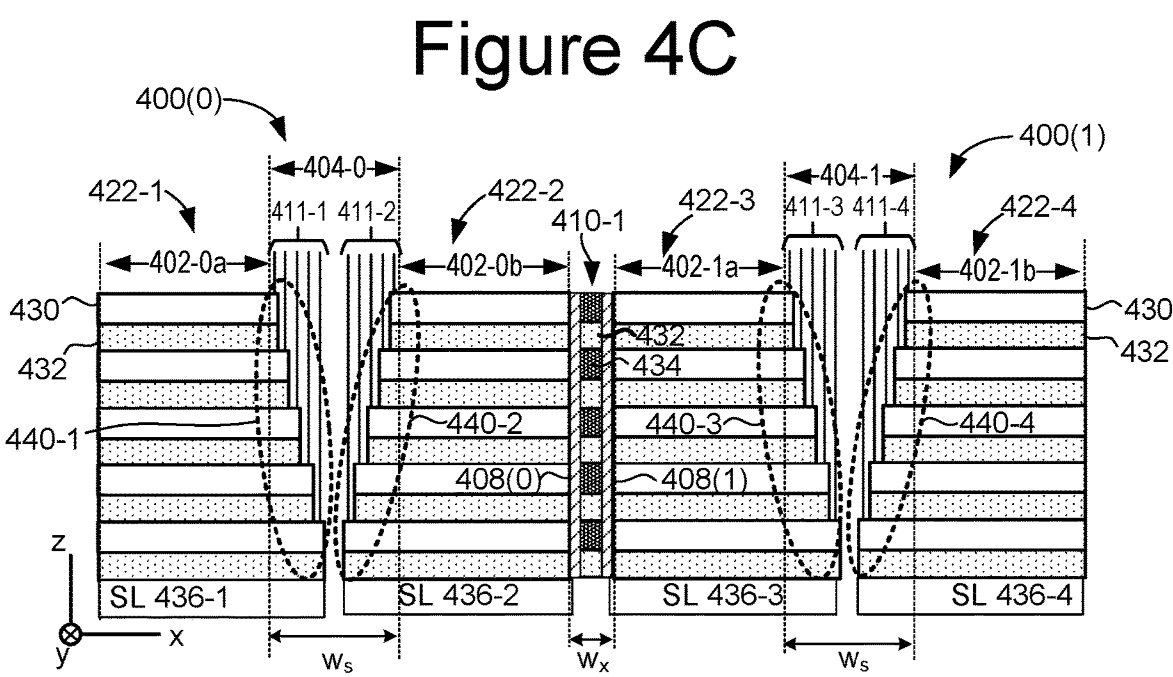
FIG. 4C is a cross-sectional view of one embodiment of the memory structure of FIG. 4B along line 403.

FIG. 4B is a block diagram depicting one embodiment of an organization of memory structure 302. FIG. 4C is a cross-sectional view of one embodiment of the memory structure 302 of FIG. 4B along line 403. FIG. 4B shows that the memory structure 302 is divided into four planes 400(0), 400(1), 400(2), 400(3). Each plane 400 has a word line (WL) hookup region 404 in the middle of the array 402 region. For example, plane 400(0) has WL hook-up 404-0 between array 402-0*a* and array 402-0*b*; plane 400(1) has WL hook-up 404-1 between array 402-1*a* and array 402-1*b*; plane 400(2) has WL hook-up 404-2 between array 402-2*a* and array 402-2*b*; and plane 400(3) has WL hook-up 404-3 between array 402-3*a* and array 402-3*b*. A word line (WL) hookup regions 404 could also be referred to as a staircase hookup region.

With reference to FIG. 4C, plane 400(0) has a first stack 422-1 of alternating conductive layers 430 and dielectric layers 432 over a first source line (SL) 436-1, and a second stack 422-2 of alternating conductive layers 430 and dielectric layers 432 over a second source line 436-2. Plane 400(1) has a third stack 422-3 of alternating conductive layers 430 and dielectric layers 432 over a third source line (SL) 436-3, and a fourth stack 422-4 of alternating conductive layers 430 and dielectric layers 432 over a fourth source line 436-4. Only a few conductive layers 430 and dielectric layers 432 are depicted; however, there typically will be many more conductive layers 430 and many more dielectric layers 432. In one embodiment, the conductive layers 430 are formed from Tungsten, although a different conductive material may be used. In one embodiment, the dielectric layers 432 are formed from SiO2, although a different dielectric (or insulating) material may be used. In some embodiments, there will be over 100 conductive layers 430. As will be discussed in further detail below, the conductive layers 430 could serve as word lines or select lines, for example.

The first stack 422-1 has an array region 402-0*a* and also has a staircase structure 440-1 in the WL hookup region 404-0. The second stack 422-1 has an array region 402-0*b* and also has a staircase structure 440-2 in the WL hookup region 404-0. The third stack 422-3 has an array region 402-1*a* and also has a staircase structure 440-3 in the WL hookup region 404-1. The fourth stack 422-4 has an array region 402-1*b* and also has a staircase structure 440-4 in the WL hookup region 404-1.

A number of staircase region contacts 411-1 are depicted as connecting to respective conducive layers in the staircase structure 440-1. A number of staircase region contacts 411-2 are depicted as connecting to respective conducive layers in the staircase structure 440-2. A number of staircase region contacts 411-3 are depicted as connecting to respective conducive layers in the staircase structure 440-3. A number of staircase region contacts are depicted as connecting to respective conducive layers in the staircase structure 440-4. The staircase region contacts may be formed as via structures and may hence be referred to staircase contact via structures. Some conductive layers in the staircase structures 440 could be part of word line layers, whereas other conductive layers in the staircase structures 440 could be part of select line layers. Hence, the staircase contacts may include WL layer contacts and select line layer contacts.

Word line drivers provide the operating voltages to the WL contacts 411-1, 411-2, 411-3, 411-4. The word line drivers are not depicted in FIG. 4C, but could be on the same semiconductor die as the memory structure 302 or on a different semiconductor die than the memory structure 302. In some embodiments, a word line driver will provide the operating voltage to a word line in two stacks. For example, a word line driver may provide an operating voltage to a first word line in stack 422-1 and to a second word line in stack 422-2. As another example, a word line driver may provide an operating voltage to a first word line in stack 422-3 and to a second word line in stack 422-4. Note that the WL hookup region 404 may also be used to provide operating voltages to select lines. Thus, more generally voltage drivers may be used to provide operating voltages to conductive layers in the respective stacks.

With reference to both FIGS. 4B and 4C, plane 400(0) is separated from plane 400(1) by first electrical isolation structure 408(0), dummy memory array 410-1, and second electrical isolation structure 408(1). With reference to FIG. 4B plane 400(2) is separated from plane 400(3) by third electrical isolation structure 408(2), dummy memory array 410-2, and fourth electrical isolation structure 408(3). With reference to FIG. 4C, the dummy memory array has a stack of alternating layers of a first material 432 and a second material 434. The first material 432 may be the same material as insulating layers 432 in the planes 400(0), 400(1). For example, the first material 432 may be SiO2. In an embodiment, the second material 434 is an insulating material that is different from the first material 432. For example, the dummy memory array may comprise alternating layers of SiO2 and SiN. Thus, the planes 400 and the dummy memory array may each have SiO2 layers at the same levels of the respective stacks. However, where the planes 400 have conductive layers 430 the dummy memory array has insulating layers 434 such as SiN.

The width ($W_X$) of the combined first electrical isolation structure 408(0), dummy memory array 410-1, and second electrical isolation structure 408(1) is substantially smaller than the width ($W_S$) of either hookup region 404. Note that each hookup region 404 contains two staircase structures 440, as well as a gap between the two staircase structures 440. If the two planes had instead been separated by two staircase structures (and gap between the two staircase structures) then the separation between the two adjacent planes would be much larger. Moreover, having the dummy memory array region 410 helps to improve the isolation between the two adjacent planes, relative to separating the stacks 422-2, 422-3 with only an electrical isolation structure 408 having a width of one or a few of the electrical isolation structures 408. It is possible under some operating conditions that a high voltage (e.g., 20V-25V) will be applied to a conductive layer 430 in stack 422-2 while a low voltage (e.g., 0V) is applied to the conductive layer 430 in stack 422-3 that is at the same level of the respective stacks. Hence, there is the possibility of strong capacitive coupling between the conductive layers 430 in the two adjacent stacks. Such capacitive coupling could impair memory operations. However, the presence of the dummy array region 410 between the two electrical isolation structures 408 reduces or eliminates capacitive coupling between the conductive layers 430 in the two adjacent stacks. Therefore, memory performance is improved.

Figure 5A:
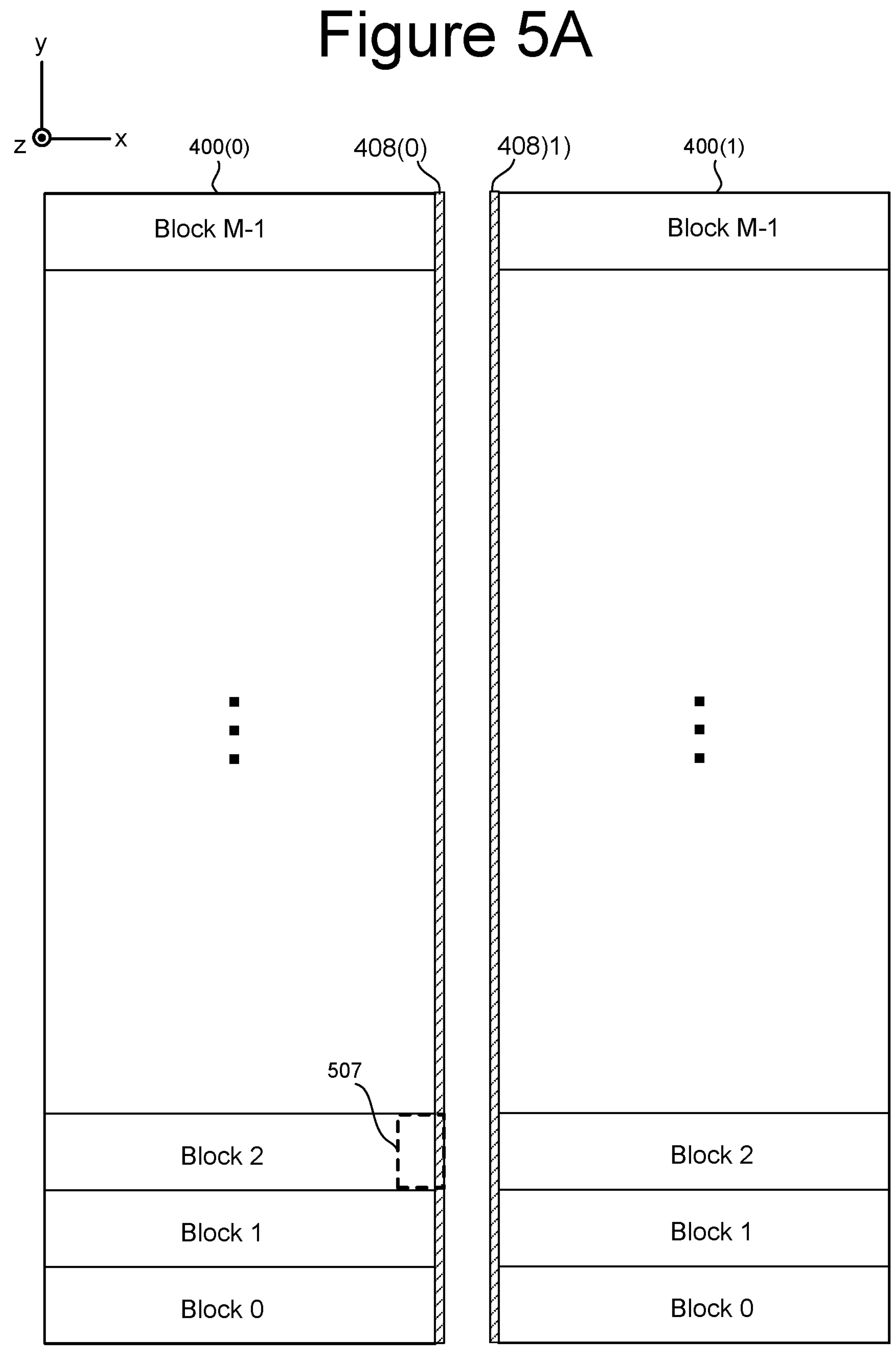
FIG. 5A depicts one embodiment of two adjacent planes.

FIG. 5A depicts one embodiment of two adjacent planes. The two planes 400(0), 400(1) have a small gap between them (in the x-dimension). Each plane contains M blocks of memory cells. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a group of connected memory cells as the memory cells of a block share a common set of word lines. For example, the word lines for a block are all connected to all of the vertical NAND strings for that block. Although FIG. 5A shows two planes 400(0)-400(2), more or fewer than four planes can be implemented.

FIGS. 5B-5E depict an example three dimensional ("3D") NAND structure that corresponds to the structure of FIG. 4 and can be used to implement memory structure 302 of FIGS. 2A and 2B.

Figure 5B:
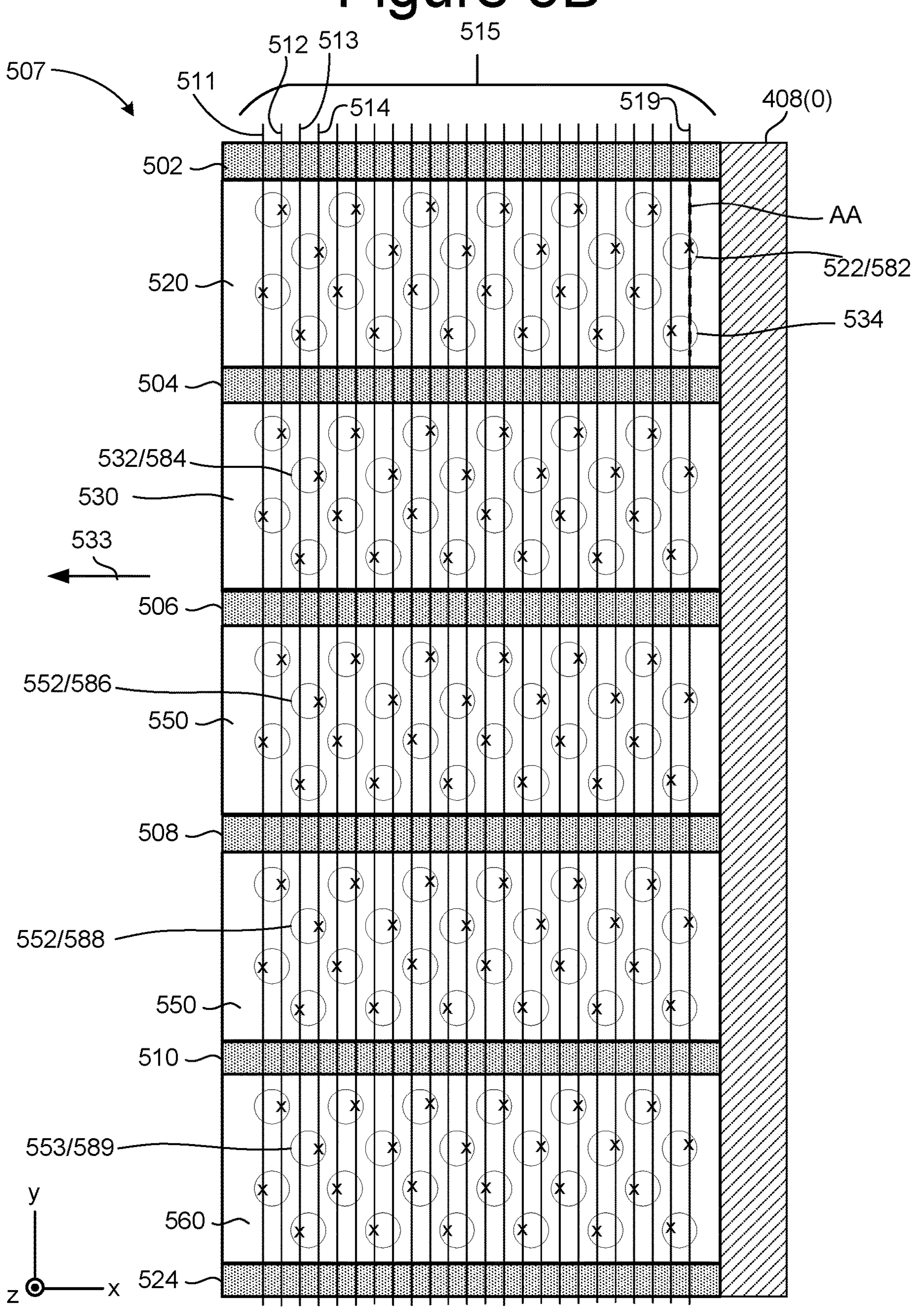
FIG. 5B is a block diagram depicting a top view of a portion 507 of Block 2 of plane 400(0) of FIG. 5A.

FIG. 5B is a block diagram depicting a top view of a portion 507 of Block 2 of plane 400(0). Electrical isolation region 408(0) is depicted on one side of the block. As can be seen from FIG. 5B, the block depicted in FIG. 5B extends in the direction of arrow 533. In one embodiment, the memory array has many layers; however, FIG. 5B only shows the top layer. FIG. 5B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 5B depicts vertical columns 522, 532, 542, 552, and 553. Vertical column 522 implements NAND string 582. Vertical column 532 implements NAND string 584. Vertical column 542 implements NAND string 586. Vertical column 552 implements NAND string 588. Vertical column 553 implements NAND string 589. More details of the vertical columns are provided below. Since the block depicted in FIG. 5B extends in the direction of arrow 533, the block includes more vertical columns than depicted in FIG. 5B.

FIG. 5B also depicts a set of bit lines 515, including bit lines 511, 512, 513, 514, . . . , 519. FIG. 5B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 514 is connected to vertical columns 522, 532, 542, 552, and 553.

The block depicted in FIG. 5B includes a set of isolation regions 502, 504, 506, 508, 510, and 524, which are formed of $SiO_2$; however, other dielectric materials can also be used. Isolation regions 502, 504, 506, 508, 510, and 524 serve to divide the top layers of the block into five regions; for example, the top layer depicted in FIG. 5B is divided into regions 520, 530, 540, 550, and 560 of which are referred to as sub-blocks. In one embodiment, isolation regions 502 and 524 separate the block from adjacent blocks. Thus, isolation regions 502 and 524 may extend down to the substrate. In one embodiment, the isolation regions 504, 506, 508, and 510 only divide the layers used to implement select gates so that NAND strings in different sub-blocks can be independently selected. Referring back to FIG. 4, the IR region may correspond to any of isolation regions 504, 506, 508 or 510. In one example implementation, a bit line only connects to one vertical column/NAND string in each of regions (sub-blocks) 520, 530, 540, 550 and 560. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 5B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 5B also shows the vertical columns being staggered. In other embodiments, different patterns of staggering can be used. In some embodiments, the vertical columns are not staggered.

In an embodiment, the electrical isolation structures 408 each have a planar shape. The planar shape of the electrical isolation structures 408 extends in the y-direction across each of the blocks in the plane (see FIG. 5A). The planar shape of the electrical isolation structures 408 extends in the z-direction from the top to the bottom of each block (see FIG. 4C). In an embodiment, the electrical isolation structures 408 are formed in slit trenches that are etched into a stack of alternating layers of materials that are used to form the adjacent planes. The slit trench may be filled in with an insulator such as SiO2. An electrical isolation structure 408 may also be referred to as a slit trench fill structure.

Figure 5C:
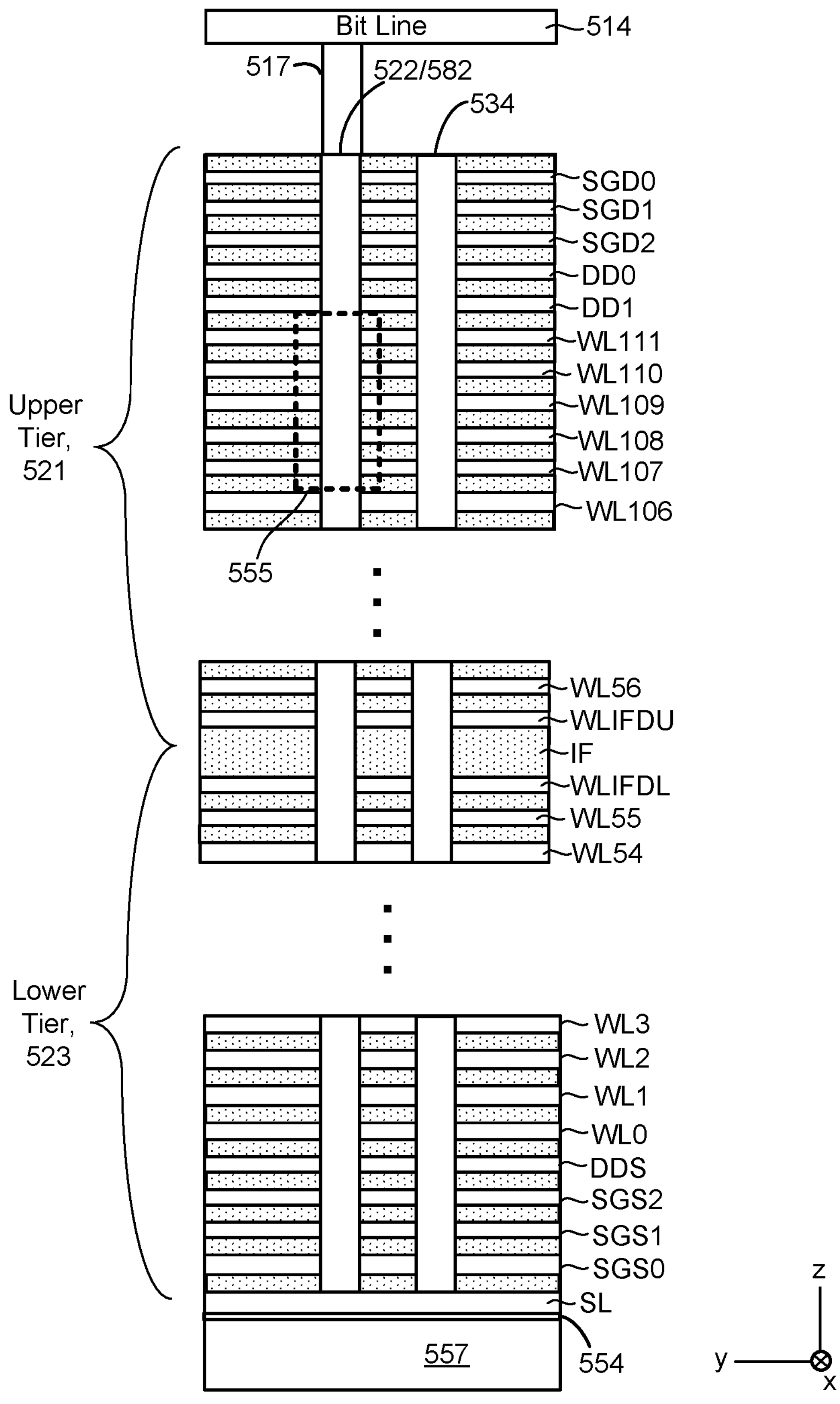
FIG. 5C depicts a portion of one embodiment of a three dimensional memory structure showing a cross-sectional view along dashed line AA of FIG. 5B.

FIG. 5C depicts a portion of one embodiment of a three dimensional memory structure 302 showing a cross-sectional view along dashed line AA of FIG. 5B. This cross sectional view cuts through vertical columns (NAND strings) 522 and 534 of region 520 (see FIG. 5B). The structure of FIG. 5C includes three drain side select gate layers (SGD0, SGD1 and SGD2). The structure of FIG. 5C also includes three source side select gate layers (SGS0, SGS1 and SGS2). The structure of FIG. 5C also includes five dummy word line layers DD0, DD1, WLIFDU, WLIDDL, DDS; one hundred twelve word line layers WL0-WL111 for connecting to data memory cells. Dielectric layers are depicted between the conductive layers just described. Other embodiments can implement more or fewer than the numbers described above for FIG. 5C. In one embodiment, SGD0, SGD1 and SGD2 are electrically connected together; and SGS0, SGS1 and SGS2 are electrically connected together.

FIG. 5C depicts an embodiment of a stack having two tiers. The two-tier stack comprises an upper tier 521 and a lower tier 523. A two-tier or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 521 and the lower tier 523 are erased independent of one another. Hence, data may be maintained in the lower tier 523 after the upper tier 521 is erased. Likewise, data may be maintained in the upper tier 521 after the lower tier 523 is erased.

Vertical columns 522 and 534 are depicted protruding through the drain side select layers, source side select layers, IF layer, dummy word line layers and word line layers. In one embodiment, each vertical column comprises a vertical NAND string. Below the vertical columns and the layers listed below is substrate 557, an insulating film 554 on the substrate, and source line SL. The NAND string of vertical column 522 has a source end at a bottom of the stack and a drain end at a top of the stack. As in agreement with FIG. 5B, FIG. 5C show vertical column 522 connected to bit line 514 via connector 517.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W111 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 5D:
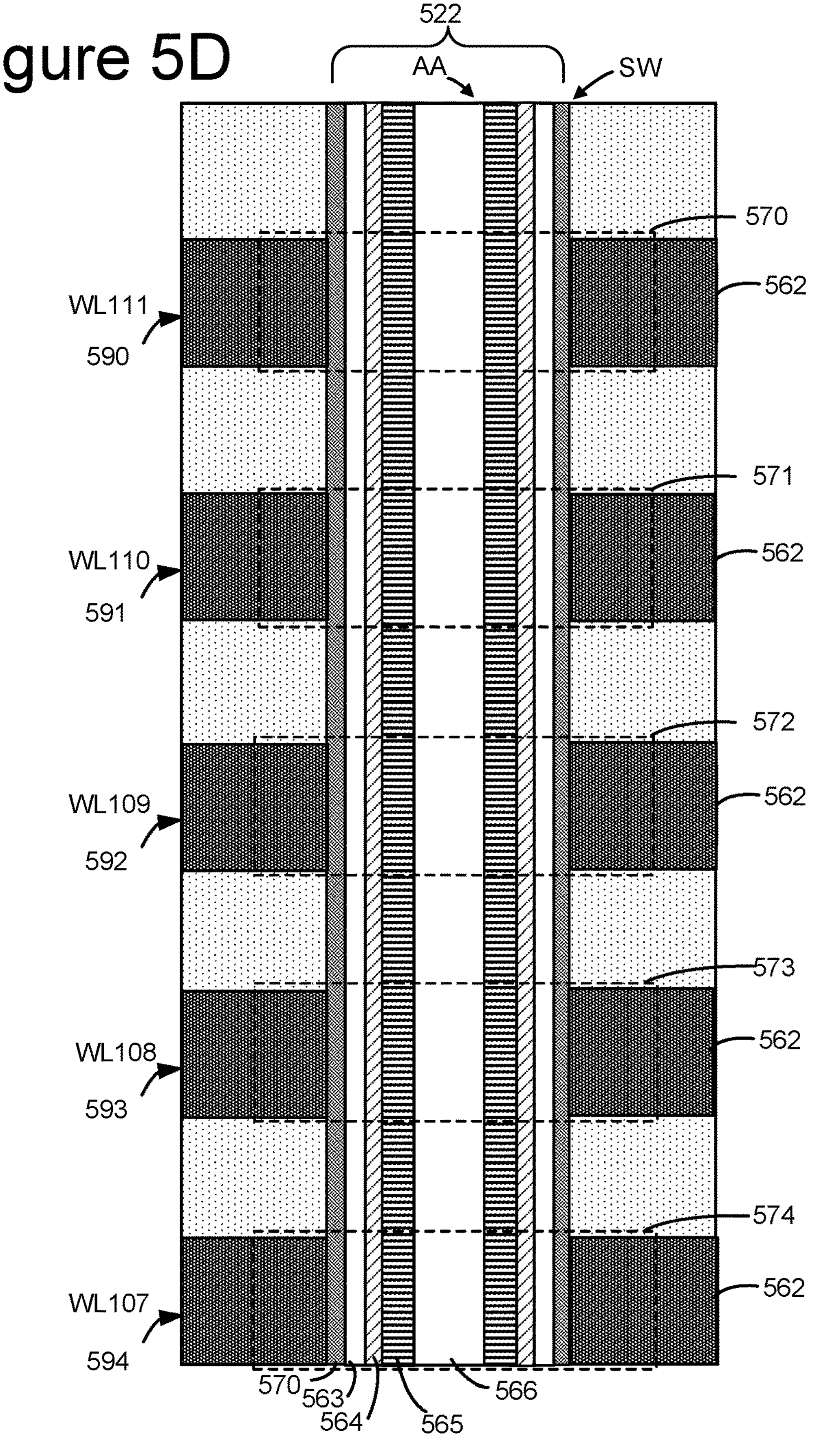
FIG. 5D depicts a view of the region 555 of FIG. 5C.

FIG. 5D depicts a view of the region 555 of FIG. 5C. Included are WL107-WL110 and dielectric layers. Data memory cell transistors 570, 571, 572, 573, and 574 are indicated by the dashed lines. A number of layers can be deposited along the sidewall (SW) of the memory hole 522 and/or within each word line layer, e.g., using atomic layer deposition. For example, each column (e.g., the pillar which is formed by the materials within a memory hole) can include a blocking oxide/block high-k material 570, charge-trapping layer or film 563 such as SiN or other nitride, a tunneling layer 564, a polysilicon body or channel 565, and a dielectric core 566. A word line layer can include a conductive metal 562 such as Tungsten as a control gate. For example, control gates 590, 591, 592, 593 and 594 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 564 can comprise multiple layers such as in an oxide-nitride-oxide configuration.

Figure 5E:
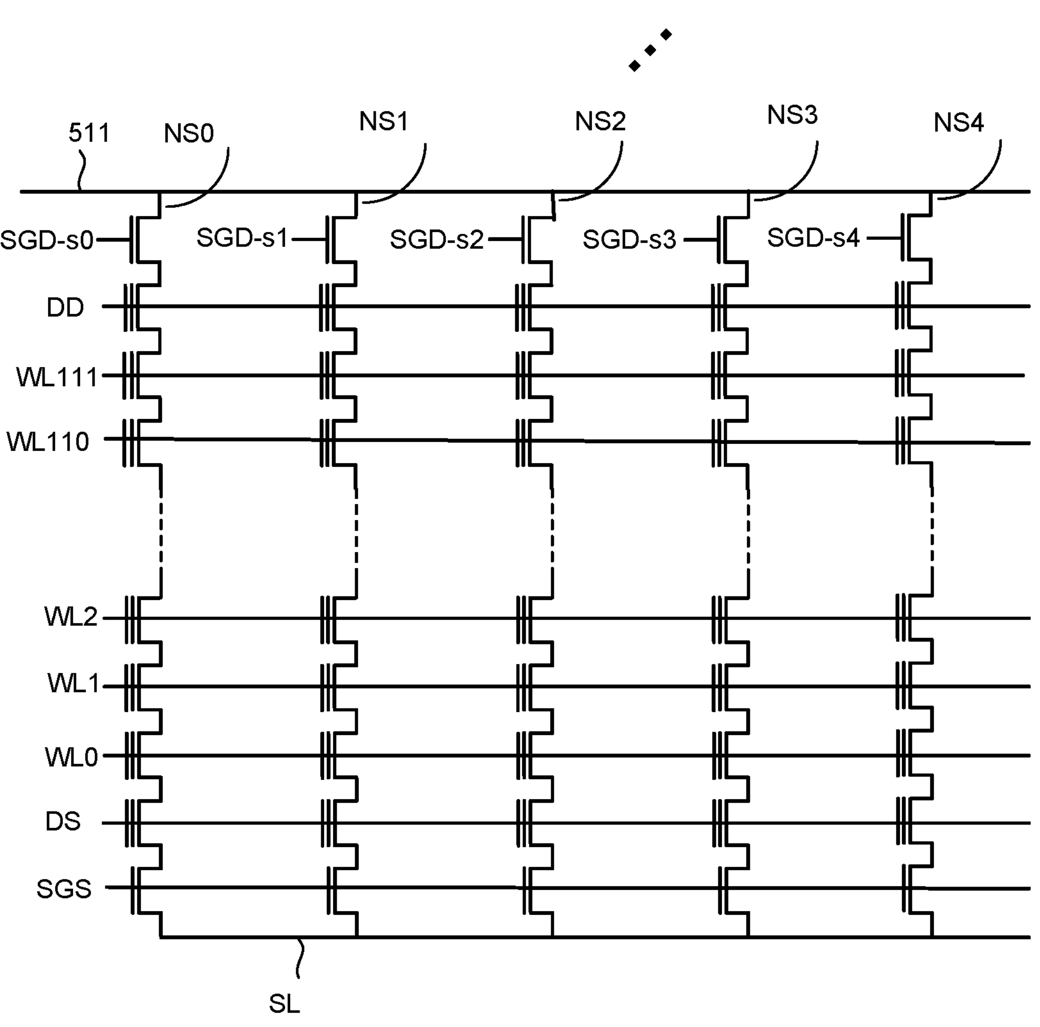
FIG. 5E is a schematic diagram of a portion of the memory depicted in FIGS. 5A-5D.

FIG. 5E is a schematic diagram of a portion of the memory depicted in FIGS. 5A-5C. FIG. 5E shows physical word lines WL0-WL111 running across the entire block. The structure of FIG. 5E corresponds to portion 507 in Block 2 of FIGS. 5A-5B, including bit lines 511, 512, 513, 514, . . . 519. Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 5E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block. FIG. 5E shows that SGD select line connects to an SGD transistor on one of the NAND strings. There are many other NAND strings in the block that are not depicted in FIG. 5E. Each SGD select line will connect to all of the NAND strings on one sub-block. The SGD transistor may be used to connect/disconnect the NAND string channel to/from the bit line.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Figure 6A:
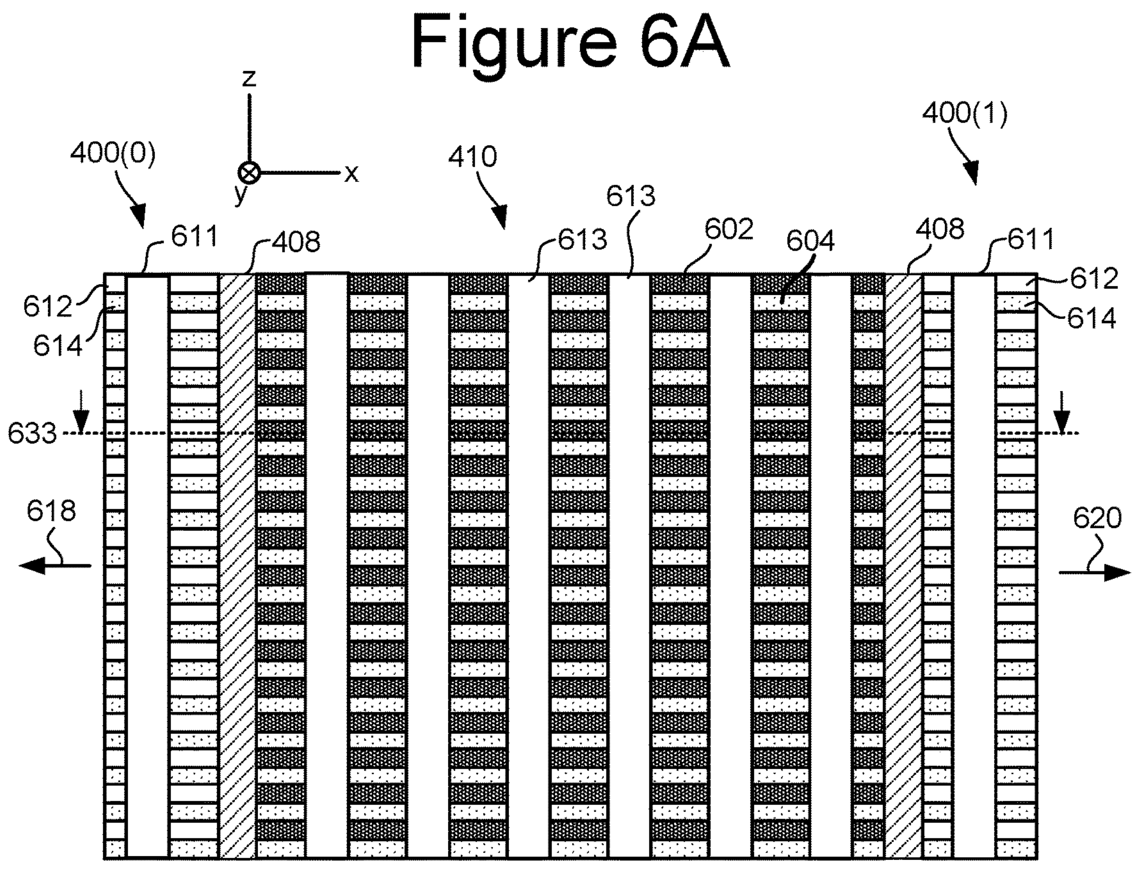
FIG. 6A is a diagram of one embodiment of a dummy memory array region between two adjacent planes.
Figure 6B:
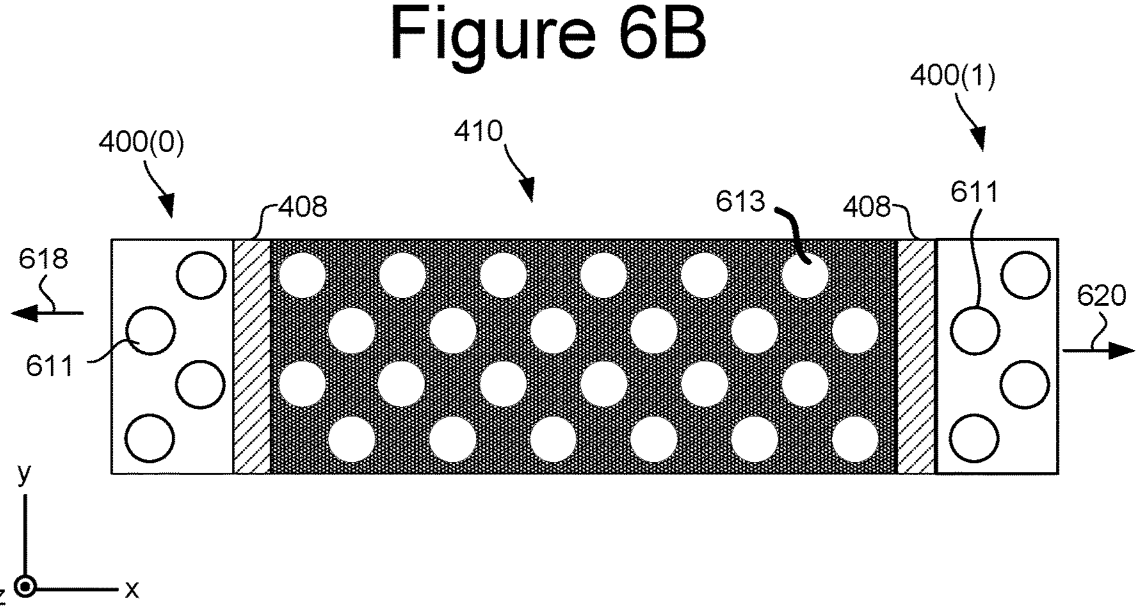
FIG. 6B depicts a view looking down (negative z-direction) along line 633 in FIG. 6A.

FIG. 6A is a diagram of one embodiment of a dummy memory array region 410 between two adjacent planes 400(0), 400(1). FIG. 6A depicts a side section view in an x-z cross-section. FIG. 6B depicts a view looking down (negative z-direction) along line 633 in FIG. 6A. Plane 400(0) extends much further in the direction indicated by arrow 618. Plane 400(1) extends much further in the direction indicated by arrow 620. The dummy memory array region 410 has a stack of first material layers 602 alternating with second material layers 604. In an embodiment, first material layers 602 are SiN and second material layers 604 are SiO2. Each array region 402 has a stack of conductive layers 612 alternating with dielectric layers 614. In an embodiment, conductive layers 612 are Tungsten and dielectric layers 614 are SiO2. Moreover, each stack has the same number of layers, in an embodiment. The first material layers 602 in the dummy array region 410 are aligned with (at the same levels of the respective stacks) the conductive layers 612 in the Planes 400. The second material layers 604 in the dummy array region 410 are aligned with (at the same levels of the respective stacks) the dielectric layers 614 in the Planes 400. Moreover, the second material layers 604 in the dummy array region 410 may be the same material (SiO2) as the dielectric layers 614.

A NAND string 611 is depicted in each of the array regions 402. Dummy NAND strings 613 are depicted in the dummy memory array region 410. In one embodiment, the dummy NAND strings 613 are formed while forming the NAND strings 611 in the planes. However, the dummy NAND strings 613 are not required in the dummy array region 410.

The dummy memory array 410 and electrical isolation structures 408 can be formed with relatively simple modifications to the formation of memory arrays in the planes. In one embodiment, the fabrication process includes depositing alternating layers of an insulator (e.g., SiO2) and a sacrificial material (e.g., SiN). These layers may be deposited both where the memory arrays of the planes are to be formed and where the dummy memory array will be formed. The insulator layers (e.g., SiO2) will serve as insulating layers 614 in the planes and insulating layer 604 in the dummy memory array 410. In one embodiment, the electrical isolation structures 408 are formed by etching slit trenches in the alternating layers of insulator (e.g., SiO2) and sacrificial material (e.g., SiN). Then, the slit trenches are filled with an insulator (e.g., SiO2) to form the electrical isolation structures 408.

At some point in the process the sacrificial material (e.g., SiN) will be replaced with a conductive material (e.g., Tungsten) to serve as the conductive layers 612 in the memory arrays. However, it is not required that the sacrificial material (e.g., SiN) in the dummy array region 410 be replaced with a conductive material (e.g., Tungsten). There are variety of ways to perform the replacement. One technique is to etch slit trenches into the stack of alternating layers of dielectric (e.g., SiO2) and sacrificial material (e.g., SiN) in the planes 400(0), 400(1). These trenches might be for forming the isolation regions 502, 504, 506, 508, 510, and 524 (see FIG. 5B) and could be etched after forming the electrical isolation structures 408. A wet etch may be used to remove the SiN (with the etchant provided though the slits that will be used to form isolation regions 502, 504, 506, 508, 510, and 524). Then the Tungsten may be formed in the region vacated by the SiN. However, other techniques may be used to remove the SiN and add the Tungsten. In one embodiment, the NAND strings are formed by drilling memory holes in the stack of alternating SiOs and SiN and then forming memory film layers in the memory holes. In one embodiment, the NAND strings are formed prior to removal of the SiN in the planes 400.

Figure 7:
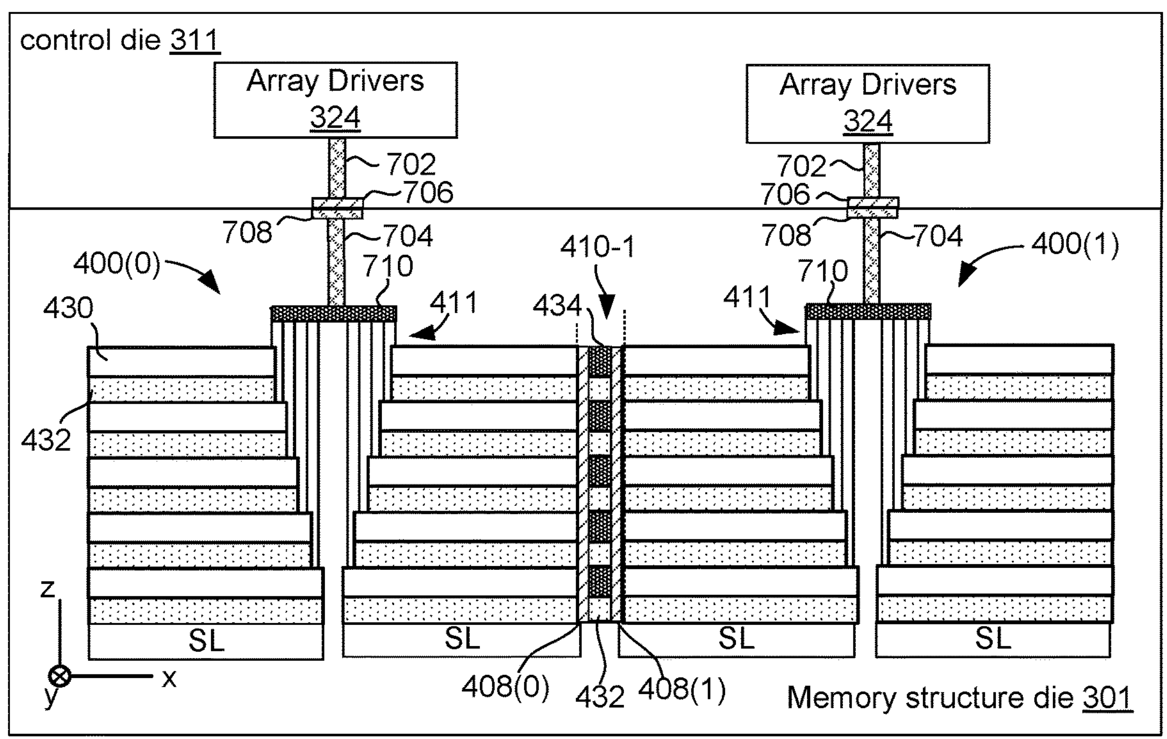
FIG. 7 is a diagram of one embodiment of a memory device in which the array drivers are located on a different semiconductor die than the memory structure.

As noted above the drivers for the staircase structures may be located on the same semiconductor die as the memory structure 302 or on a different die from the memory structure 302. FIG. 7 is a diagram of one embodiment of a memory device in which the array drivers are located on a different semiconductor die than the memory structure 302. The control die 311 has a number of array drivers 324, which are part of the row control circuitry. In an embodiment, the control die 311 is bonded to the memory structure die 301 by way of a large number of bond pads 706, 708. Via structures 702 in the control die 311 connect to via structures 704 in the memory structure die 301 by way of bond pads 706, 708. The memory structure die 301 has a metal layer 710 that is used to route the voltages from the array drivers to staircase via structures that make electrical contact to the staircase structures.

Figure 8:
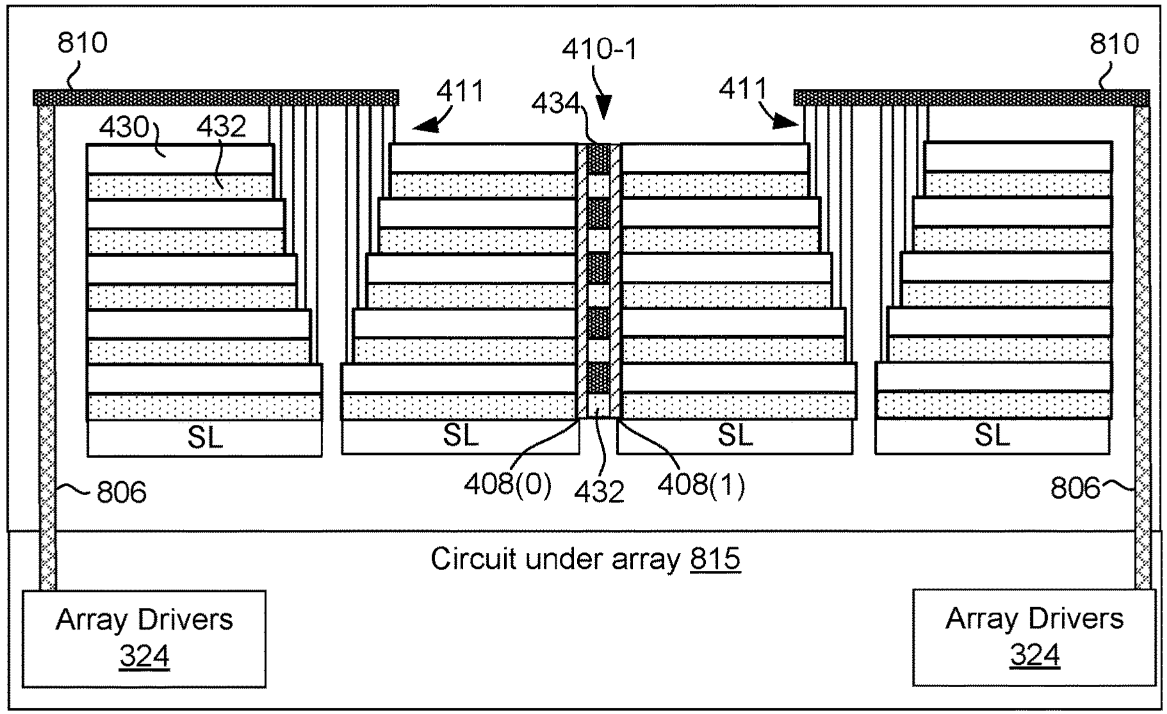
FIG. 8 is a diagram of one embodiment of a memory device in which the array drivers are located on the same semiconductor die as the memory structure.

FIG. 8 is a diagram of one embodiment of a memory device in which the array drivers are located on the same semiconductor die as the memory structure 302. In an embodiment, the array drivers 324 are located in a circuit under the array 815. However, the array drivers 324 could instead be located on a peripheral region of the memory structure die 301. Via structures 806 connect metal layer 810 that is used to route the voltages from the array drivers to staircase via structures that make electrical contact to the staircase structures.

FIGS. 7 and 8 depict two embodiments of the locations of the array drivers and connections to the staircase structures. However, the array drivers may be located elsewhere and other connections may be used.

Figure 9:
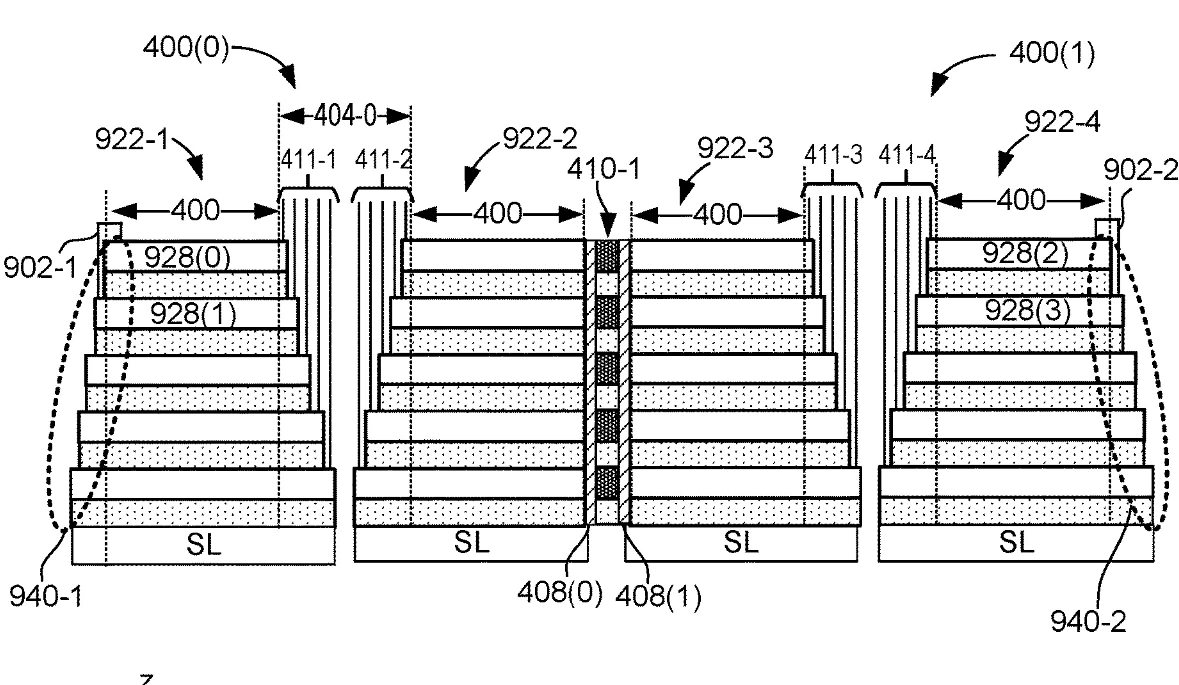
FIG. 9 depicts one embodiment of a memory structure in which there is a dummy staircase on an outside edge of the planes.
Figure 9:
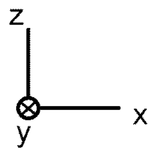

FIG. 9 depicts one embodiment of a memory structure in which there is a dummy staircase on an outside edge of the planes. Plane 400(0) has stacks 922-1 and 922-2. Plane 400(1) has stack 922-3 and 922-4. Stack 922-1 has a dummy staircase 940-1 on an outside edge. Stack 922-4 has a dummy staircase 940-2 on an outside edge. There is a shunt 902-1 on dummy staircase 940-1 that electrically connects conductive layer 928(0) to conductive layer 928(1). There is a shunt 902-2 on dummy staircase 940-2 that electrically connects conductive layer 928(2) to conductive layer 928 (3). The shunts 902 may be used to, for example, electrically connect two or more select line layers (e.g., SGD). The shunts 902 may be used to, for example, electrically connect two or more dummy word line layers.

In view of the foregoing, a first embodiment includes an apparatus comprising a first array region having a first stack of alternating insulating layers and conductive layers and a second stack of alternating insulating layers and conductive layers. The first array region has a first word line hookup region between the first stack and the second stack. The apparatus has a second array region having a third stack of alternating insulating layers and conductive layers and a fourth stack of alternating insulating layers and conductive layers. The second array region has a second word line hookup region between the third stack and the fourth stack. The apparatus has a dummy array region between the first array region and the second array region. The dummy array region has stack of alternating first layers comprising a first material and second layers comprising a second material that is different from the first material. The apparatus has a first electrical isolation structure between the dummy array region and the first array region. The first electrical isolation structure comprises an insulator between the dummy array region and the conductive layers of the second stack, wherein the first electrical isolation structure comprises an insulator between the dummy array region and the second stack. The apparatus has a second electrical isolation structure between the dummy array region and the second array region, wherein the second electrical isolation structure comprises an insulator between the dummy array region and the conductive layers of the third stack.

In a second embodiment, in furtherance to the first embodiment, the first layers of the dummy array region are aligned with the insulating layers in the first array region and the second array region. The second layers of the dummy array region are aligned with the conductive layers in the first array region and the second array region. The insulating layers are formed from the first material.

In a third embodiment, in furtherance to the second embodiment, the second material is an insulator.

In a fourth embodiment, in furtherance to any of the first to third embodiments, the first array region comprises vertical NAND strings in the first stack. The first array region comprises vertical NAND strings in the second stack. The second array region comprises vertical NAND strings in the third stack. The second array region comprises vertical NAND strings in the fourth stack. The dummy array region comprises dummy vertical NAND strings.

In a fifth embodiment, in furtherance any of the first to fourth embodiments, the first stack of alternating insulating layers and conductive layers comprises a first staircase structure in the first word line hookup region. The second stack of alternating insulating layers and conductive layers comprises a second staircase structure in the first word line hookup region. The third stack of alternating insulating layers and conductive layers comprises a third staircase structure in the second word line hookup region. The fourth stack of alternating insulating layers and conductive layers comprises a fourth staircase structure in the second word line hookup region.

In a sixth embodiment, in furtherance of any of the first to fifth embodiments, the first electrical isolation structure comprises an insulator that extends from a top to a bottom of the second stack of word lines. The second electrical isolation structure comprises an insulator that extends from a top to a bottom of the third stack of word lines.

In a seventh embodiment, in furtherance any of the first to sixth embodiments, the first array region comprises a first plurality of 3D blocks of NAND memory cells, each block having a top and a bottom. The first electrical isolation structure has a planar shape that extends in a first direction from the top to the bottom of each 3D block of the first plurality of 3D blocks and that extends in a second direction across each 3D block in the first plurality of 3D blocks. The second array region comprises a second plurality of 3D blocks of NAND memory cells, each block having a top and a bottom. The second electrical isolation structure has a planar shape that extends in the first direction from the top to the bottom of each 3D block of the second plurality of 3D blocks and that extends in the second direction across each 3D block in the second plurality of 3D blocks.

In an eighth embodiment, in furtherance to the seventh embodiment, the apparatus further includes a first plurality of bit lines over the first array region. Each bit line of the first plurality of bit lines extends in the first direction. The apparatus further includes a second plurality of bit lines over the second array region. Each bit line of the second plurality of bit lines extends in the first direction.

In a ninth embodiment, in furtherance to any of the first to eighth embodiments, the apparatus further includes a first plurality of voltage drivers. Each voltage driver in the first plurality of voltage drivers configured to provide an operating voltage to a first conductive layer in the first stack and a second conductive layer in the second stack. The apparatus further includes a second plurality of voltage drivers. Each voltage driver in the second plurality of voltage drivers configured to provide an operating voltage to a third conductive layer in the third stack and a fourth conductive layer in the fourth stack.

In a tenth embodiment, in furtherance to the ninth embodiment, the apparatus comprises a first semiconductor die comprising the first array region, the second array region, the dummy array region, the first electrical isolation structure, and the second electrical isolation structure. The apparatus comprises a second semiconductor die bonded to the first semiconductor die, the second semiconductor die comprising the first plurality of voltage drivers and the second plurality of voltage drivers.

In an eleventh embodiment, in furtherance to the ninth embodiment, the apparatus comprises a semiconductor die comprising the first array region, the second array region, the dummy array region, the first electrical isolation structure, and the second electrical isolation structure. The semiconductor die also comprises the first plurality of voltage drivers and the second plurality of voltage drivers.

One embodiment includes a method for forming adjacent planes in a memory die. The method comprises forming a first plane having a first stack of alternating insulating layers and conductive layers and a second stack of alternating insulating layers and conductive layers, the first plane having a first mid-plane word line hookup region between the first stack and the second stack. The method comprises forming a second plane having a third stack of alternating insulating layers and conductive layers and a fourth stack of alternating insulating layers and conductive layers, the second plane having a second mid-plane word line hookup region between the third stack and the fourth stack. The method comprises forming a dummy array region between the first plane and the second plane, including forming alternating layers of a first material and a second material that is a different material than the first material. The method comprises forming a first electrical isolation structure between the dummy array region and the first plane. The method comprises forming a second electrical isolation structure between the dummy array region and the second plane.

One embodiment includes a NAND memory device comprising a first plane having a first stack of alternating insulating layers comprising a first insulating material and conductive layers comprising a conductive material and a second stack of alternating insulating layers comprising the first insulating material and conductive layers comprising the conductive material. The first stack has a first staircase structure adjacent to the second stack. The second stack has a second staircase structure adjacent to the first stack. The NAND memory device comprises a second plane having a third stack of alternating insulating layers comprising the first insulating material and conductive layers comprising the conductive material and a fourth stack of alternating insulating layers comprising the first insulating material and conductive layers comprising the conductive material. The third stack has a third staircase structure adjacent to the fourth stack. The fourth stack has a fourth staircase structure adjacent to the third stack. The NAND memory device has a dummy array region between the first plane and the second plane. The dummy array region has a stack of alternating first layers comprising the first insulating material and second layers comprising a second insulating material. The NAND memory device has a first slit trench fill structure between the dummy array region and the first plane, wherein the first slit trench fill structure comprises an insulator between the dummy array region and the second stack. The NAND memory device has a second slit trench fill structure between the dummy array region and the second plane, wherein the second slit trench fill structure comprises an insulator between the dummy array region and the third stack.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

a first array region having a first stack of alternating insulating layers and conductive layers in x-y planes and a second stack of alternating insulating layers and conductive layers in the x-y planes, the first array region having a first word line hookup region between the first stack and the second stack;

a second array region having a third stack of alternating insulating layers and conductive layers in the x-y planes and a fourth stack of alternating insulating layers and conductive layers in the x-y planes, the second array region having a second word line hookup region between the third stack and the fourth stack, wherein the second array region is adjacent to the first array region in an x-direction;

a first plurality of bit lines over the first array region, wherein each bit line of the first plurality of bit lines extends in a y-direction;

a second plurality of bit lines over the second array region, wherein each bit line of the second plurality of bit lines extends in the y-direction;

a dummy array region between the first array region and the second array region in the x-direction, the dummy array region comprising a stack of alternating first layers comprising a first material and second layers comprising a second material that is different from the first material, the alternating first layers and second layers in the x-y planes;

a first electrical isolation structure between the dummy array region and the first array region, wherein the first electrical isolation structure comprises an insulator between the dummy array region and the second stack; and a second electrical isolation structure between the dummy array region and the second array region, wherein the second electrical isolation structure comprises an insulator between the dummy array region and the third stack.

2. The apparatus of claim 1, wherein:

the first layers of the dummy array region are aligned with the insulating layers in the first array region and the second array region;

the second layers of the dummy array region are aligned with the conductive layers in the first array region and the second array region; and the insulating layers are formed from the first material.

3. The apparatus of claim 2, wherein the second material is an insulator.

4. The apparatus of claim 1, wherein:

the first array region comprises vertical NAND strings in the first stack;

the first array region comprises vertical NAND strings in the second stack;

the second array region comprises vertical NAND strings in the third stack;

the second array region comprises vertical NAND strings in the fourth stack; and the dummy array region comprises dummy vertical NAND strings.

5. The apparatus of claim 1, wherein:

the first stack of alternating insulating layers and conductive layers comprises a first staircase structure in the first word line hookup region;

the second stack of alternating insulating layers and conductive layers comprises a second staircase structure in the first word line hookup region;

the third stack of alternating insulating layers and conductive layers comprises a third staircase structure in the second word line hookup region; and the fourth stack of alternating insulating layers and conductive layers comprises a fourth staircase structure in the second word line hookup region.

6. The apparatus of claim 1, wherein:

the first electrical isolation structure comprises an insulator that extends from a top to a bottom of the second stack in a z-direction; and the second electrical isolation structure comprises an insulator that extends from a top to a bottom of the third stack in the z-direction.

7. The apparatus of claim 1, wherein:

the first array region comprises a first plurality of 3D blocks of NAND memory cells, each block having a top and a bottom;

the first electrical isolation structure has a planar shape that extends in a z-direction from the top to the bottom of each 3D block of the first plurality of 3D blocks and that extends in the y-direction across each of the 3D blocks in the first plurality of 3D blocks;

the second array region comprises a second plurality of 3D blocks of NAND memory cells, each block having a top and a bottom; and the second electrical isolation structure has a planar shape that extends in the z-direction from the top to the bottom of each 3D block of the second plurality of 3D blocks and that extends in the y-direction across each of the 3D blocks in the second plurality of 3D blocks.

8. The apparatus of claim 1, further comprising:

a first plurality of voltage drivers, each voltage driver in the first plurality of voltage drivers configured to provide an operating voltage to a first conductive layer in the first stack and a second conductive layer in the second stack; and a second plurality of voltage drivers, each voltage driver in the second plurality of voltage drivers configured to provide an operating voltage to a third conductive layer in the third stack and a fourth conductive layer in the fourth stack.

9. The apparatus of claim 8, wherein the apparatus comprises:

a first semiconductor die comprising the first array region, the second array region, the dummy array region, the first electrical isolation structure, and the second electrical isolation structure; and a second semiconductor die bonded to the first semiconductor die, the second semiconductor die comprising the first plurality of voltage drivers and the second plurality of voltage drivers.

10. The apparatus of claim 8, wherein the apparatus comprises a semiconductor die comprising:

the first array region, the second array region, the dummy array region, the first electrical isolation structure, and the second electrical isolation structure; and the first plurality of voltage drivers and the second plurality of voltage drivers.

11. A method for forming adjacent planes in a memory die, the method comprising:

forming a first plane having a first stack of alternating insulating layers and conductive layers in x-y planes and a second stack of alternating insulating layers and conductive layers in the x-y planes, the first plane having a first mid-plane word line hookup region between the first stack and the second stack;

forming a second plane having a third stack of alternating insulating layers and conductive layers the x-y planes and a fourth stack of alternating insulating layers and conductive layers in the x-y planes, the second plane having a second mid-plane word line hookup region between the third stack and the fourth stack, wherein the second plane is adjacent to the first plane in an x-direction;

forming a dummy array region between the first plane and the second plane in the x-direction, including forming alternating layers of a first material and a second material that is a different material than the first material, the alternating layers of the first material and the second material in the x-y planes;

forming a first electrical isolation structure between the dummy array region and the first plane;

forming a second electrical isolation structure between the dummy array region and the second plane;

forming a first plurality of bit lines over the first plane, wherein each bit line of the first plurality of bit lines extends in a y-direction; and forming a second plurality of bit lines over the second plane, wherein each bit line of the second plurality of bit lines extends in the y-direction.

12. The method of claim 11, wherein forming the first plane, the second plane, and the dummy array region includes:

forming alternating layers of the first material and a sacrificial material that extend across the first plane, the second plane, and the dummy array region, wherein the sacrificial material comprises the second material; and replacing the layers of the sacrificial material in the first plane and the second plane but not the dummy array region with conductive material to form the conductive layers in the first plane and the second plane.

13. The method of claim 12, wherein forming the first electrical isolation structure and forming the second electrical isolation structure comprise:

etching a first trench between the first plane and the dummy array region, including etching the first trench in the alternating layers of the first material and the sacrificial material;

etching a second trench between the second plane and the dummy array region, including etching the second trench in the alternating layers of the first material and the sacrificial material;

forming the first electrical isolation structure in the first trench; and forming the second electrical isolation structure in the second trench.

14. A NAND memory device comprising:

a first plane having a first stack of alternating insulating layers comprising a first insulating material and conductive layers comprising a conductive material and a second stack of alternating insulating layers comprising the first insulating material and conductive layers comprising the conductive material, the first stack having a first staircase structure adjacent to the second stack, the second stack having a second staircase structure adjacent to the first stack;

a second plane having a third stack of alternating insulating layers comprising the first insulating material and conductive layers comprising the conductive material and a fourth stack of alternating insulating layers comprising the first insulating material and conductive layers comprising the conductive material, the third stack having a third staircase structure adjacent to the fourth stack, the fourth stack having a fourth staircase structure adjacent to the third stack;

a dummy array region between the first plane and the second plane, the dummy array region having a stack of alternating first layers comprising the first insulating material and second layers comprising a second insulating material;

a first slit trench fill structure between the dummy array region and the first plane, wherein the first slit trench fill structure comprises an insulator between the dummy array region and the second stack; and a second slit trench fill structure between the dummy array region and the second plane, wherein the second slit trench fill structure comprises an insulator between the dummy array region and the third stack;

wherein extending in sequentially a first direction are the first stack, the first staircase structure, the second staircase structure, the second stack, the first slit trench fill structure, the dummy array region, the second slit trench fill structure, the third stack, the third staircase structure, the fourth staircase structure, and the fourth stack.

15. The NAND memory device of claim 14, further comprising:

a first plurality of staircase voltage drivers;

first staircase contacts that connect the first plurality of staircase voltage drivers to respective layers of the conductive layers in the first staircase structure;

second staircase contacts that connect the first plurality of staircase voltage drivers to respective layers of the conductive layers in the second staircase structure;

a second plurality of staircase voltage drivers;

third staircase contacts that connect the second plurality of staircase voltage drivers to respective layers of the conductive layers in the third staircase structure; and fourth staircase contacts that connect the second plurality of staircase voltage drivers to respective layers of the conductive layers in the fourth staircase structure.

16. The NAND memory device of claim 14, further comprising:

first NAND strings extending vertically through the first stack and the second stack;

second NAND strings extending vertically through the third stack and the fourth stack; and dummy NAND strings extending vertically through the stack in the dummy array region.

17. The NAND memory device of claim 14, wherein:

the first slit trench fill structure extends from a top to a bottom of the second stack; and the second slit trench fill structure extends from a top to a bottom of the third stack.

18. The NAND memory device of claim 17, wherein:

the first plane comprises a first plurality of three-dimensional (3D) blocks of memory cells, each 3D block having a top and a bottom;

the first slit trench fill structure has a planar shape that extends in a second direction from the top to the bottom of each 3D block of the first plurality of 3D blocks and that extends in a third direction across each 3D block in the first plurality of 3D blocks, the second direction substantially perpendicular to the first direction, the third direction substantially perpendicular to both the first direction and the second direction;

the second plane comprises a second plurality of 3D blocks of memory cells, each 3D block having a top and a bottom; and the second slit trench fill structure has a planar shape that extends that extends in the second direction from the top to the bottom of each 3D block of the second plurality of 3D blocks and that extends in the third direction across each 3D block in the second plurality of 3D blocks.

19. The NAND memory device of claim 18, further comprising:

a first plurality of bit lines over the first stack and the second stack, wherein each bit line of the first plurality of bit lines extends in the third direction; and a second plurality of bit lines over the third stack and the fourth stack, wherein each bit line of the second plurality of bit lines extends in the third direction.

* * * * *